United States Patent
Alic et al.

(10) Patent No.: US 10,230,353 B2
(45) Date of Patent: Mar. 12, 2019

(54) NONLINEAR SIGNAL FILTERING

(71) Applicant: Apsidon, Inc., San Diego, CA (US)

(72) Inventors: Nikola Alic, La Jolla, CA (US);
Eduardo Temprana Giraldo, La Jolla, CA (US)

(73) Assignee: Apsidon, Inc., San Diego, CA (US)

( * ) Notice: Subject to any disclaimer, the term of this patent is extended or adjusted under 35 U.S.C. 154(b) by 0 days.

(21) Appl. No.: 15/906,958

(22) Filed: Feb. 27, 2018

(65) Prior Publication Data
US 2018/0254769 A1 Sep. 6, 2018

Related U.S. Application Data

(60) Provisional application No. 62/527,860, filed on Jun. 30, 2017, provisional application No. 62/466,513, filed on Mar. 3, 2017.

(51) Int. Cl.
| | | |
|---|---|---|
| *H03H 7/30* | (2006.01) | |
| *H03H 7/40* | (2006.01) | |
| *H03K 5/159* | (2006.01) | |
| *H03H 21/00* | (2006.01) | |

(52) U.S. Cl.
CPC .... *H03H 21/0016* (2013.01); *H03H 21/0023* (2013.01); *H03H 2021/0079* (2013.01); *H03H 2021/0087* (2013.01)

(58) Field of Classification Search
CPC ....... H03H 21/0016; H03H 2021/0087; H03H 2021/0079; H03H 21/0023; H04L 25/03885; H04B 10/677
USPC ................................ 375/350, 229, 230, 232
See application file for complete search history.

(56) References Cited

U.S. PATENT DOCUMENTS

| | | | |
|---|---|---|---|
| 6,420,886 B1 | 7/2002 | Ho et al. | |
| 8,731,413 B1 | 5/2014 | Dave et al. | |
| 9,287,979 B2 | 3/2016 | Dave et al. | |
| 2001/0038674 A1 | 11/2001 | Trans | |
| 2003/0063663 A1* | 4/2003 | Bryant ............. | H04L 25/03885 375/229 |

(Continued)

FOREIGN PATENT DOCUMENTS

WO 2012094188 A1 7/2012

OTHER PUBLICATIONS

Barros et al., "Optical Modulator Optimization for Orthogonal Frequency-Division Multiplexing," Journal of Lightwave Technology, vol. 27, No. 13, Jul. 1, 2009, pp. 2370-2378.

(Continued)

*Primary Examiner* — Phuong Phu
(74) *Attorney, Agent, or Firm* — The Mueller Law Office, P.C.

(57) ABSTRACT

In a nonlinear signal filtering system, a signal having a series of signal samples is filtered. The signal samples are affected by interactions with adjacent signal samples and nonlinear distortions. The system contains a series of alternating linear system elements and nonlinear system elements that are used for mitigation of distortion resulting from the nonlinear distortions with memory effects. The linear system elements can scale each signal sample in the series of signal samples by scaling parameters and sums a plurality of consecutive scaled signal samples, and the nonlinear system elements can transform the output of the linear system elements according to instantaneous nonlinear functions.

30 Claims, 21 Drawing Sheets

(56) References Cited

U.S. PATENT DOCUMENTS

| | | |
|---|---|---|
| 2004/0032296 A1 | 2/2004 | Akaiwa |
| 2005/0127996 A1 | 6/2005 | Jelonnek et al. |
| 2005/0163268 A1 | 7/2005 | McCallister |
| 2005/0286619 A1 | 12/2005 | Haddadin et al. |
| 2008/0031633 A1* | 2/2008 | Hoshida ............... H04B 10/677 398/149 |
| 2009/0196629 A1 | 8/2009 | Zheng et al. |
| 2012/0224866 A1 | 9/2012 | Gaete et al. |
| 2016/0087604 A1 | 3/2016 | Kim et al. |
| 2016/0191020 A1 | 6/2016 | Velazquez |

OTHER PUBLICATIONS

Benvenuto et al., "Single Carrier Modulation With Nonlinear Frequency Domain Equalization: An Idea Whose Time Has Come—Again," IEEE, vol. 98, No. 1, Jan. 2010, pp. 69-96.

Nespola et al., "Equalization Techniques for 100Mb/s Data Rates on Si-POF for Optical Short Reach Applications," Optical Society of America, Mar. 2007.

Piazza Robert et al., "Data Predistortion for Multicarrier Satellite Channels Based on Direct Learning," IEEE Transactions on Signal Processing, vol. 62 Issue: 22, Sep. 18, 2014, pp. 5868-5880.

Watts et al., "An FPGA-Based Optical Transmitter Design Using Real-Time DSP for Advanced Signal Formats and Electronic Predistortion," Journal of Lightwave Technology, vol. 25, No. 10, Oct. 2007.

Yang, Ken, "Flatten DAC frequency response," EDN Network, Apr. 13, 2006, pp. 1-6.

Zhou et al., "64-Tb/s (640x107-Gb/s) PDM-36QAM transmission over 320km using both pre- and post-transmission digital equalization", Optical Society of America, Jan. 2011, pp. 571-577.

International Search Report dated Jun. 4, 2018 for PCT Patent Application Nu. PCT/US2018/020047.

* cited by examiner

NONLINEAR SIGNAL FILTERING

RELATED APPLICATIONS

The application claims benefit of U.S. Provisional Patent Application No. 62/466,513 filed on Mar. 3, 2017 and entitled "Look-Up-Table Based Modification of Transmission Signals", and claims benefit of U.S. Provisional Patent Application No. 62/527,860 filed on Jun. 30, 2017 and entitled "Nonlinear Signal Filtering," which are incorporated herein by reference in their entirety for all purposes.

BACKGROUND

Systems affect signals by inducing both linear and nonlinear distortions, including those due to memory effects. Memory in this context means that a system response at a time instant of interest (that was otherwise intended to be uncorrelated with other time instances) depends on, and is influenced by, signal values in surrounding time instants. Some examples of electrical systems containing signals that suffer from linear and nonlinear distortion, including memory effects, include optical communication systems, wireless communication systems, satellite communication systems, computer data storage systems, image processing systems, video processing systems, sound processing systems, and controls systems, among others. The impairments (both linear and nonlinear) diminishing the quality of the useful signal are in practice commonly countered by some means of filtering, equalization, or compensation (often used interchangeably).

One method to compensate signals that have linear and nonlinear distortions with memory effects, is accomplished by filters that are based on polynomial expansions, where the filter output (y[n]) is a weighted linear combination of the input signal (x[n]) at different time instances, plus the input signal at different time instances raised to a given power (determined by the nonlinearity order), plus the (linear) combination of various cross-products of the input signal at different time instances each raised to an appropriate power. For example, filters with the full-complexity polynomial expansion based on the Volterra series are accordingly called Volterra filters. For example, the output of a Volterra filter of order 2 and memory of 2 will have the form:

$$y[3] = c_1 \cdot x[1] + c_2 \cdot x[2] + c_3 \cdot x[3] + c_{11} \cdot x[1]^2 + c_{22} \cdot x[2]^2 + c_{33} \cdot x[3]^2 + c_{11} \cdot x[1] \cdot x[2] + c_{13} \cdot x[1] \cdot x[3] + c_{23} \cdot x[2] \cdot x[3] \quad (1)$$

In Equation 1, $c_i$ are parameters multiplying the signal at the $i^{th}$ instance in time, $c_{jj}$ are parameters multiplying the squared term of the signal at the $j^{th}$ instance in time, and $c_{jk}$ (where j does not equal k) are parameters multiplying the signal cross terms at the $j^{th}$ and $k^{th}$ instances in time. However, filters employing the Volterra series are complex to implement in practice. Specifically, the number of parameters in the Volterra approach scales exponentially with the number of signal instances in surrounding time epochs that affect a given signal state (i.e., scales exponentially with memory). The exponential nature of nonlinear filters employing the Volterra series can be expensive to implement, and impractical in high-speed systems, due to the large amount of operations that are necessary to be performed, which in practice correspond to large amounts of RAM, or taps, or excessive power consumption associated with the number of computations required. Furthermore, filters employing the Volterra series rely on polynomial functions, and are not well equipped to mitigate distortions that, in practice, are not necessarily well approximated by continuous polynomials. For example, ADC and DAC components often introduce nonlinear distortions that are not well approximated by continuous polynomial functions, and are better approximated by piecewise continuous functions. As a result, systems with nonlinear signal distortions resulting from ADC or DAC components in combination with components that introduce memory effects in the signal are not well mitigated by filters employing the Volterra series.

Other methods for filtering signals that suffer from both linear and nonlinear distortion are accomplished using polynomial expansions including some, but not all, of the terms of the Volterra series. One such variation of Volterra filters are Memory Polynomial filters, which contain a portion of the terms in the Volterra series (e.g., only the diagonal terms) and do not contain the cross-products of the input signal at different time instances. For example, the first output (y[1]) of a Memory Polynomial filter of order 2 and memory of 3 will have the form:

$$y[1] = c_1 \cdot x[1] + c_2 \cdot x[2] + c_3 \cdot x[3] + c_{11} \cdot x[1]^2 + c_{22} \cdot x[2]^2 + c_{33} \cdot x[3]^2 \quad (2)$$

In Equation 2, x[n], y[n], and the parameters, $c_i$ and $c_{jj}$, are defined the same as they are in Equation 1. Nevertheless, even though memory polynomials are less complex than Volterra series, the price to pay for the omission of the cross-terms is a significant decline in performance, and they are equally limited to continuous polynomial forms.

Electronic communications systems typically convert a digital input signal into an analog form by upconverting, filtering, and amplifying the signal for transmission using analog components. The digital and analog components can achieve only limited accuracy, and nonlinear distortions with memory effects are commonplace. An example of components that can induce nonlinear distortions, in addition to the digitizers in communications systems are analog linear power amplifiers. As linear power amplifiers approach the end of their dynamic range, saturation can occur, which induces a departure from a linear behavior, or response, thus, if left unattended, leading to distortions, or otherwise departures from the intended signal shaping. Linear power amplifiers are some of the more expensive components in transmitters used in communications systems, and less expensive amplifiers tend to have worse nonlinearity. Additionally, high baud rate digital transmission systems tend to suffer from memory effects, which manifest as intersymbol interference (ISI). ISI is exacerbated in systems utilizing narrow band channels, such as telephone voice communication channels, where the channel response to one symbol is not allowed to transgress into the time-slot occupied by the next successive symbol.

High-speed information transmission in fiber-optic communication systems is another example of a system with linear and nonlinear distortions, including memory effects. In such systems, optical waves are used as carrier signals, and the information to be transmitted typically originates in electronic form as digital data. Prior to transmission, the electronic information is imprinted (e.g. modulated) onto an optical carrier signal by an optical transmitter. The modulated optical carrier signal is then transmitted over a fiber-optic, and is received by an optical receiver. Information from the received optical signal is then transformed back into an electronic form, such as digital data.

Imprinting electronic information onto an optical carrier signal can be performed by an electro-optical modulator, such as a dual-polarization Mach-Zehnder modulator (DP- MZM). A DP-MZM is capable of modulating information onto each of two orthogonal polarizations of a dual-polarized optical carrier signal.

In optical communications systems, as one example, memory effects can be caused by the frequency response of waveguides and electrodes within the DP-MZM in addition to the walk-off effect between the optical and electrical waves. Thus, impairments such as amplitude loss of the signal at a time t=0 can depend on a signal that was previously transmitted at time t=−1, can additionally depend on a signal transmitted at time t=−2, and so on. This can result in loss, change, or other impairments to information even before transmission (e.g., directly at the output of the DP-MZM). In addition to the memory effects, the MZM structure (and therefore, the DP-MZM, too) inherently possesses a nonlinear amplitude characteristic.

Another example of a type of optical communications system that can be affected by linear and nonlinear distortions with memory effects are those that utilize intensity modulated direct detection (i.e., IMDD systems). In IMDD systems, the power output of an optical source is modulated to encode a signal. The optical signal is transmitted through a channel (e.g., through free-space (i.e., air), or through an optical fiber), and then the signal is then received by a receiver. In an IMDD system, the receiver utilizes direct detection, for example by detecting the signal intensity using a photodiode. Such systems can operate in the wavelength band of visible or infrared light. An additional source of nonlinear distortions in IMDD systems is related to the fact that the power of the transmitted signal is related to the square of the intensity of the signal, and it is typically the signal intensity that is detected (e.g., by a photodiode) rather than the amplitude of the electric field, often referred to as the 'square-law' detection. Thus, the square-law detection acts in IMDD systems acts in addition to any further sources of nonlinearity such as MZIs, driver amplifiers, etc, further complicating detection in these systems.

Another example of a type of optical communications system that can be affected by linear and nonlinear distortions with memory effects are those that utilize heterodyning. Such systems encode information in an optical signal as modulation of the phase and/or frequency (i.e., wavelength) of electromagnetic radiation. A transmitter can encode heterodyne modulated information on an optical signal that is transmitted over a channel, and then detected in a receiver. Heterodyne detection in the receiver can employ local oscillators, and the detected signal can be compared with the reference light from the local oscillator (LO). Such systems can also operate in the wavelength band of visible or infrared light.

Some solutions attempt to reduce, mitigate or eliminate the effects of nonlinearity in electrical and optical transmission systems. Unfortunately, the presence of nonlinearities within circuitry of electrical and optical transmitters can reduce the ability to correct impairments at the receiver. Such attempted solutions often act on memoryless nonlinearity, and can thus be incapable of correcting impairments to the transmission signal that result from system memory effects.

Other solutions attempt to correct transmission signal impairments by using frequency response equalization at the transmitter. However, these solutions are often unsatisfactory because, in addition to the frequency response (e.g., the linear response of the system), transmitters often possess a nonlinear nature of the response that is inherent in the amplitude cosine transfer function of the transmitter.

Still other solutions seek to combine linear equalization, as well as equalizing the nonlinear response. However, these solutions are unsatisfactory because they neglect the system memory of the nonlinear response of the optical transmitters.

A common solution to correct for memory effects in communication systems are decision feedback equalizers (DFEs). DFEs typically employ a tapped delay line, which allows the equalizer to correct a signal suffering from memory effects, such as intersymbol interference. One type of DFE is a time domain DFE (TDDFE), where operations are performed on a symbol-by-symbol basis in the time domain. Several types of DFEs operate in the frequency domain, such as hybrid DFE (HDFE), extensionless HDFE (ELDFE), and iterative block DFE (IBDFE), which can reduce the computational complexity by roughly 25% compared with TDDFE. All DFEs can in principle compensate for memory effects in signals with nonlinearity, however, their effectiveness in mitigating nonlinear impairments is very limited and cannot adequately satisfy the requirements in modern communication, or control systems.

SUMMARY

In some embodiments, a nonlinear signal filtering system is disclosed for filtering a signal with both memory and nonlinear distortions, where the system contains alternating linear system elements and nonlinear system elements to compensate for memory effects (i.e., signal states in surrounding time instants affecting a given signal state) and nonlinear distortions.

In some embodiments, a nonlinear signal filtering system is disclosed, comprising a series of one or more filtering stages that filter a signal comprising a series of signal samples, each filtering stage comprising alternating linear system elements and nonlinear system elements. In some embodiments, the linear system elements and nonlinear system elements correct 1) sample interactions between a plurality of consecutive signal samples in the signal, and 2) nonlinear distortions in a value of each signal sample. In some embodiments, the nonlinear signal filtering system comprises from 2 to 10 filtering stages connected sequentially in series to receive and filter the series of signal samples.

In some embodiments, the nonlinear signal filtering system described above, filter a signal comprising a first signal sample in the series of signal samples affected by an interaction with N consecutive signal samples adjacent to the first signal sample, and the value of each signal sample in the series of signal samples is subject to nonlinear distortions. In some embodiments, the linear system elements in each filtering stage comprise linear filtering functions each comprising from 1 to N parameters, and the nonlinear system elements in each filtering stage comprise nonlinear filtering functions each comprising from 1 to M parameters. The total number of parameters used in each filtering stage to correct 1) the sample interactions between the plurality of consecutive signal samples in the signal, and 2) the nonlinear distortions in the value of each signal sample, can be equal to, or less than the sum of N and M.

In some embodiments, a nonlinear signal filtering system is provided, comprising a first linear system element that receives a signal comprising a series of signal samples, a first nonlinear system element connected to receive an output of the first linear system element, and a second linear system element connected to receive an output of the first nonlinear system element. In some embodiments, a first signal sample in the series of signal samples is affected by an interaction with one or more consecutive signal samples adjacent to the first signal sample, and a value of each signal sample in the series of signal samples is subject to nonlinear distortions. In some embodiments, the first linear system element scales each signal sample in the series of signal samples by scaling parameters and sums a plurality of consecutive scaled signal samples, the first nonlinear system element transforms the output of the first linear system element according to an instantaneous nonlinear function, and the second linear system element scales the output of the first nonlinear system element by scaling parameters and sums a plurality of consecutive scaled outputs of the first nonlinear system element. In some embodiments, the scaling parameters in the first linear system element and the second linear system element and the instantaneous nonlinear function of the first nonlinear system element correct for the signal sample interactions and the nonlinear distortions in the value of each signal sample.

In some embodiments, a method is disclosed for filtering a signal with both memory and nonlinear distortions, where the method includes using alternating linear system elements, i.e. filters, and nonlinear system elements to compensate for memory effects (i.e., signal states in surrounding time instants affecting a given signal state) combined with nonlinear distortions, the latter, too possibly having a response containing "memory".

In some embodiments, one or more systems carry out one or more steps of a method that involves filtering a nonlinear signal, in which a signal is provided that comprises a series of signal samples, wherein a first signal sample in the series of signal samples is affected by an interaction with one or more consecutive signal samples adjacent to the first signal sample, and a value of each signal sample is subject to nonlinear distortions. The signal is filtered through a first linear system element, wherein the first linear system element scales each signal sample by a scaling coefficient and sums a plurality of consecutive scaled signal samples. An output of the first linear system element is filtered using a first nonlinear system element, wherein the first nonlinear system element transforms the output of the first linear system element according to an instantaneous nonlinear function. In some embodiments, the scaling parameters in the first linear system element and the instantaneous nonlinear function of the first nonlinear system element can correct for the signal sample interactions and the nonlinear distortions in the value of each signal sample in the signal.

In some embodiments, one or more systems carry out one or more steps of a method that involves filtering a signal, in which a signal is provided that comprises a series of signal samples, wherein a first signal sample in the series of signal samples is affected by an interaction with one or more consecutive signal samples adjacent to the first signal sample, and a value of each signal sample is subject to nonlinear distortions. The signal is filtered through a first linear system element, wherein the first linear system element scales each signal sample by a scaling coefficient and sums a plurality of consecutive scaled signal samples. An output of the first linear system element is filtered using a first nonlinear system element, wherein the first nonlinear system element transforms the output of the first linear system element according to a multi-dimensional look-up-table. The scaling parameters in the first linear system element and the multi-dimensional look-up-table of the first nonlinear system element can correct for the signal sample interactions and the nonlinear distortions in the value of each signal sample in the signal.

DETAILED DESCRIPTION

Figure 1A:
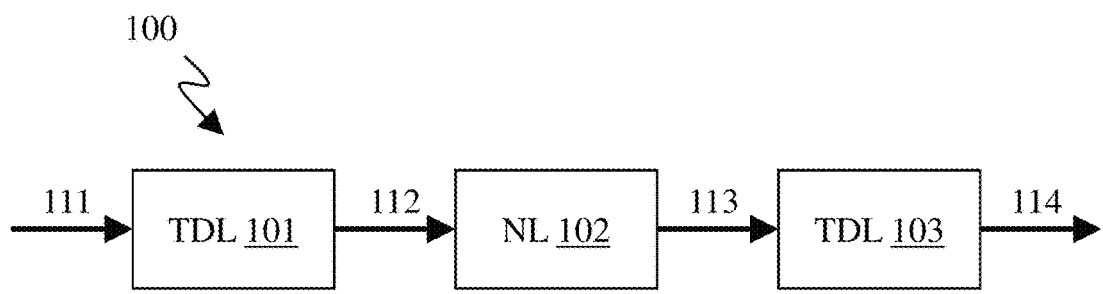
FIG. 1A is a simplified schematic diagram of a nonlinear filtering system, in accordance with some embodiments.

Many electrical system signals are affected by linear distortions, nonlinear distortions, and memory effects. In conventional systems, the combination of nonlinear distortions and memory distortions have not been properly addressed because of the inability to implement filters that are capable of compensating for a combination of memory and nonlinear impairments at a level of complexity acceptable for practical implementation. A major factor preventing proper distortion reduction in such systems is the associated complexity of implementing existing solutions. Described herein is a system for signal filtering to account for both linear and nonlinear distortions, including memory effects, using a system that is significantly less complex and/or computationally expensive than existing solutions.

The term "memory" in this context means that a system response at a time instant of interest (that was otherwise intended to be independent) depends on, and is influenced by, signal states in surrounding time instants. One example of a memory distortion is intersymbol interference in communication systems. It is common for system components to induce linear and nonlinear distortion. Additionally, some electrical and optoelectronic components can induce linear or nonlinear effects, including memory, simultaneously.

The filtering systems and methods described herein can be applied to any signal in a system that suffers from linear distortions and nonlinear distortions, including memory effects. Some examples of systems containing such signals that could benefit from the systems and methods described herein include communication systems (e.g., optical communication systems, wireless communication systems, satellite communication systems), computer data storage systems, image processing systems, video processing systems, sound processing systems, and controls systems, among others.

The nonlinear signal filtering systems and methods described herein can be applied to a signal before the linear and nonlinear distortions and memory effects occur (i.e., pre-compensation), and/or after the linear and nonlinear distortions and memory effects occur (i.e., post-compensation). The term "nonlinear signal filtering system" as used herein, refers to a system capable of correcting a signal suffering from nonlinear distortions (with or without memory effects). Additionally, the term "filter" or "filtering" can refer to any process (e.g., a linear operation with or without memory, or a nonlinear operation with or without memory) that acts upon and transforms a signal, unless otherwise specified.

For example, using the systems and methods described herein, high-speed optical transmission systems, among other types of communication systems, can achieve better performance, realize longer reach, and provide a high degree of reproducibility of information-bearing waveforms. As a result, improved generation of modulation formats of high cardinality can be achieved, resulting in transmission signals having a high density of information packing, and/or high spectral efficiency. Such improvements can be achieved using a system that combines the capabilities of linear equalization and nonlinear transmitter equalization and further takes system memory effects into account. Additionally, these improvements can be achieved without requiring significant modifications in existing optical transmission technology or the manufacturing process of the optical transmitters.

A system is disclosed herein for digital filtering of digital time discretized data representing a signal (e.g. in communication systems as a series of symbols, but more generally as a series of signal samples) impaired by memory, and nonlinear distortions. (The terms "symbol" and "signal sample" are used interchangeably herein, except as explicitly stated in the description or claims.) In some embodiments, the system contains a concatenation or series of alternating linear system elements (e.g., elements that perform linear filtering) and nonlinear system elements (e.g., elements that perform nonlinear transformations). The linear filters and nonlinear transformations can compensate for the linear impairments and linear memory effects (e.g., intersymbol interference, adjacent consecutive symbol interactions, or signal states in surrounding adjacent time instants affecting a given signal state), as well as for the nonlinear distortions. The system including linear filters and nonlinear transformations can also compensate for nonlinear distortions including memory effects, if present. The filtering system can be implemented to correct the imperfections or impairments due to the effects of memory, linear distortion and nonlinear distortion in optical transmission systems. The term "correct" as used herein, refers to reducing, mitigating or eliminating imperfections affecting the signal in its generation, or reception, or both, or impairments affecting the signal on the course of its transmission through the channel. The filtering system can be applied to a signal before transmission to pre-compensate for the memory, linear and nonlinear effects in the optical transmission system, or be applied to a signal after transmission to compensate for the memory, linear and nonlinear effects in the optical transmission system.

In some embodiments, the linear system elements perform linear operations on a series of symbols (i.e., symbols from an input signal, or symbols that have been transformed by previous system elements) that are input into the linear system elements, which include operations on more than one symbol over time. For example, a linear element can be a tapped delay line, which convolves an input series of symbols with a temporal impulse response. In contrast, in some embodiments, the nonlinear system elements perform nonlinear operations on a series of symbols (i.e., symbols from an input signal, or symbols that have been transformed by previous system elements) that are input into the nonlinear system elements, which include operations on only one symbol. In other words, in some embodiments, the linear system elements perform operations with memory, while the nonlinear system elements perform only instantaneous operations (i.e., perform operations utilizing instantaneous functions). The term "instantaneous function", as used herein, refers to a function that operates on only one symbol out of a series of symbols making up a signal. That is in contrast to a function that includes memory, and operates on more than one symbol in a series of symbols making up a signal (e.g., a function utilized by a tapped delay line).

An advantage of the systems and methods described herein are that the systems and methods can be implemented to correct signals with memory, linear impairments and nonlinear distortions without significantly increasing the complexity of the system or the number of required computations. One factor contributing to the low complexity of the system is that the number of parameters in the system scales roughly linearly with the number of signal states or symbols in surrounding time instants affecting a given signal state or symbol, rather than exponentially, as in polynomial filters, such as those employing the Volterra series. Therefore, the systems and methods described herein can be practical to implement in many electrical systems with signals that suffer from both linear and nonlinear distortions, including systems with memory effects that span over many signal samples (or symbols) within the signal that also have several sources of nonlinearity, such as high-speed optical transmission systems with higher-order QAM.

The systems and methods described herein, have several key advantages compared to other systems and methods aimed specifically at correcting distortions in signals caused by amplifiers with nonlinear characteristics. Specifically, the systems and methods described herein enable the compensation of general nonlinear systems with memory, specifically by means of digital filtering, or by manipulating digital representation of signals, unlike some prior attempts that are only able to compensate for distortions in nonlinear systems that can be described by continuous functions, which, in fact, had no means of implementation in practice. For example, some prior attempts relied on analytical function inverses, which in practice are difficult to determine, rendering those approaches merely theoretical, or conceptual, while the approach described herein has been demonstrated in practice and on 'real' data. The systems and methods described herein are able to compensate for distortions that are described by ad-hoc nonlinear functions (i.e., a collection of nonlinear functions, a combination thereof, piece-wise linear profiles, and piece-wise nonlinear functions), which as best as possible mitigate the nonlinear impairment. In some embodiments, the nonlinear functions are instantaneous nonlinear functions, as described above. Moreover, the systems and methods described herein can be implemented in pre-, post- and joint pre-and-post-compensation and/or equalization, i.e., at the transmitter, receiver and partially at both transmitting and the receiving ends of the system.

Furthermore, the systems and methods described herein are improved compared to previous, superficially similar, attempts in that the systems and methods described herein are successful in mitigating systems incorporating nonlinearity with memory, while relying on a system and/or method that incorporates only instantaneous (i.e., memoryless) nonlinear elements and/or steps.

Further yet, the systems and methods described herein unambiguously postulate the importance of the sequence of elements (in different variants, as dictated by the system under consideration), whereas some previous attempts aimed at the nonlinear amplifier pre-distortion considered an improper ordering of the linear and nonlinear elements for pre-distortion. Additionally, in some embodiments, the present invention allows doublets or triplets of alternating linear and non-linear elements (e.g., L-NL, NL-L, L-NL-L, or NL-L-NL, where L represents a linear element and NL represents a nonlinear element, as further described below).

The nonlinear signal filtering systems and methods described herein can also be applied to optical communications system that utilize intensity modulated direct detection (i.e., IMDD systems). The nonlinear filtering systems can be used to pre-compensate or post-compensate for nonlinear distortions in IMDD systems, which are induced by components in the transmitter and/or receiver, and/or occurring in the channel during transmission. For example, the nonlinear filtering systems can compensate for the nonlinear relationship between the power modulated signal that is transmitted and the signal intensity that is received.

Additionally, the nonlinear signal filtering systems and methods described herein can also be applied to optical communications system that utilize heterodyning. The nonlinear filtering systems can be used to pre-compensate or post-compensate for nonlinear distortions in heterodyne systems, which are induced by components in the transmitter and/or receiver, and/or occurring in the channel during transmission.

The nonlinear signal filtering systems and methods described herein can also be applied to signals that are one dimensional, or multidimensional. For example, a signal carried by electric field (which, as a physical quantity can be described as a complex number, in the mathematical sense) would have both real and imaginary components (i.e., would correspond to a two-dimensional signal) that suffers from linear and nonlinear distortions, with memory effects. This signal can be filtered using the systems and methods described herein. Additionally, in some embodiments, nonlinear interactions (or coupling) between the dimensions (i.e., interactions between the real and imaginary components in the latter example) of an input signal can also be compensated for using the signal filtering systems and methods described herein.

Systems for Filtering Nonlinear Signals with Memory Effects

In some embodiments, a nonlinear signal filtering system includes a series of one or more groups of alternating linear and nonlinear system elements. An example of the linear system element is a linear tapped delay line (TDL). An example of the nonlinear system element is a filter that transforms the output of the linear system element by an instantaneous nonlinear function. These types of linear and nonlinear system elements, when concatenated together in series, can compensate for an interaction with two or more consecutive symbols in the signal (i.e., memory effects), and nonlinear distortions in the amplitude of the signal. Furthermore, the implementation of such a system is straightforward, and does not add significant complexity compared with a system that can only compensate for linear distortions with memory effects, such as a linear feed forward equalizer (FFE), or a decision feed-back equalizer (DFE), containing a tapped delay line driven feedback loop.

In some embodiments, the nonlinear signal filtering system filters a signal containing a series of symbols, wherein each symbol in the series is affected by an interaction with one or more consecutive symbols adjacent to that symbol (i.e., has system memory effects or symbol interactions), and the amplitude of each symbol in the series is also subject to nonlinear distortions. In some embodiments, the consecutive symbols are before, or after, or surrounding (before and after) the symbol under consideration. In some embodiments, the number of consecutive symbols that affects the first symbol can be any number depending on the system design; however, the number of consecutive symbols that are accounted for by the linear system elements in the signal filtering system can be from 1 to 5, or from 2 to 5, or from 1 to 10, or from 2 to 10, or from 1 to 20, or from 2 to 20, or from 1 to 100, or from 2 to 100, or from 1 to 200, or from 2 to 200, or from 1 to 2000, or from 2 to 2000. Additionally, in some embodiments, the nonlinear distortions in amplitude are described by functions that are piece-wise linear, nonlinear functions, or piece-wise nonlinear functions.

In some embodiments, a nonlinear signal filtering system includes a first linear system element, a first nonlinear system element, and a second linear system element. In some embodiments, the first linear system element convolves the signal with a first impulse response. In other words, the first linear element scales (i.e., multiplies) each symbol in the series by scaling parameters and sums two or more consecutive scaled symbols. The term "parameter", as used herein, refers to a scalar value used by an operation to transform a signal. For example, the parameters in the linear system elements can be the scalar coefficients of the impulse response. In another example, the parameters in a nonlinear system element can be coefficients in a nonlinear function, or be scalar values in a look-up-table. In some embodiments, the first nonlinear system element transforms the output of the first linear system element according to a nonlinear function, or an instantaneous nonlinear function. In some embodiments, the second linear system element convolves the outputs from the nonlinear element with a second impulse response. In other words, the second linear system element scales each successive output of the first nonlinear element by scaling parameters and sums two or more consecutive scaled symbols. The number of consecutive scaled symbols that are summed by each of the linear system elements can be from 1 to 5, or from 2 to 5, or from 1 to 10, or from 2 to 10, or from 1 to 20, or from 2 to 20, or from 1 to 100, or from 2 to 100, or from 1 to 200, or from 2 to 200, or from 1 to 2000, or from 2 to 2000. The linear system elements can include, but are not limited to, tapped delay lines.

The nonlinear system element can transform the output of the first linear system element by a continuous nonlinear function, or a nonlinear function that is piece-wise linear, or a nonlinear polynomial, or a piece-wise nonlinear polynomial. In some embodiments, the nonlinear functions are instantaneous nonlinear functions. In some embodiments, the nonlinear function is quadratic, cubic, quartic, higher degree (i.e., $5^{th}$, $6^{th}$, $7^{th}$, or greater than $4^{th}$ degree), logarithmic, exponential, sinusoidal, inverse-sinusoidal, or sigmoidal. The nonlinear element can also transform the output of the first linear system element using a look-up-table (LUT), for example, as described in the aforementioned U.S. Provisional Patent Application No. 62/466,513. In such cases, the transformation need not be described by an explicit mathematical form. In some embodiments, the scaling parameters in the first linear system element and the second linear system element, and the nonlinear function (or LUT) of the first nonlinear element, are chosen to compensate for the symbol interactions (e.g., memory effects), linear distortions and/or nonlinear distortions in the symbol amplitude. It should be understood that LUTs are not required as nonlinear elements in the systems described herein. LUTs can be used as the nonlinear elements in some embodiments, and when concatenated in series with linear system elements with memory (e.g., TDLs), the system can compensate signals to reduce, mitigate or eliminate nonlinear distortions with memory effects.

One non-limiting example of a nonlinear signal filtering system is shown in FIG. 1A for filtering an input signal 111 to generate an output 114, in accordance with some embodiments. The nonlinear signal filtering system 100 shown in the figure includes a first tapped delay line (TDL) (or other linear system element or filter) 101, a nonlinear (NL) system element 102, and a second TDL (or other linear system element or filter) 103. The input signal 111 generally includes a series of symbols $x_i$, where m symbols interact (i.e., induce memory effects) with a given symbol $x_m$, such that the symbols in the signal that interact with a symbol $x_m$ is the set:

$$[x] = x_1, x_2, x_3, \ldots x_{m-1}, x_m. \quad (3)$$

In addition to each symbol $x_i$ in the series being affected by system memory, the amplitude of each symbol $x_i$ in the series can also be subject to linear and nonlinear distortions.

The first TDL 101 performs an operation to convolve the input signal 111 with an impulse response and generates an output 112 designated $w_i$, where $$w_i = \Sigma a_i x_i = a_1 x_1 + a_2 x_2 + a_3 x_3 + \ldots + a_m x_m. \quad (4)$$

As each subsequent symbol $x_i$ arrives at the first TDL 101, a new output 112 (i.e., $w_i$) is generated according to equation 4. The function governing the operation of the linear system element 101 (i.e., equation 4) includes a set of parameters $a_i$.

The outputs 112 of the first TDL 101 (i.e., $w_i$ values) are processed by the nonlinear system element 102. The nonlinear system elements in this disclosure do not incorporate memory effects, and simply perform a nonlinear operation on a given $w_i$. For example, the nonlinear system element 102 can be a cubic function, and raise each $w_i$ to the power of 3, or other appropriate exponentiation function. Additionally, the nonlinear system element 102 can transform the output 112 (i.e., $w_i$) according to a nonlinear function including a set of parameters $b_i$. The output 113 of the nonlinear system element 102 is $y_i$, and as each subsequent output 112 (i.e., $w_i$) arrives at the nonlinear system element 102, a new output 113 (i.e., $y_i$) is generated.

Furthermore, the output 113 of the nonlinear system element 102 can be transformed according to the second TDL 103 operating similarly to the first TDL 101 to generate the output 114 designated $z_i$, where $$z_i = \Sigma c_i y_i = c_1 y_1 + c_2 y_2 + c_3 y_3 + \ldots + c_m y_m. \quad (5)$$

As each subsequent output 113 (i.e., $y_i$) arrives at the second TDL 103, a new $z_i$ is generated according to equation 5, which includes a set of parameters $c_i$. The output 114 of the second TDL 103 is therefore the set of $z_i$ symbols.

The parameters of all of the linear and nonlinear system elements of the filter (i.e., $a_i$, $b_i$ and $c_i$) can be chosen such that the output 114 of the nonlinear signal filtering system 100 is a filtered signal. In some embodiments, the initial input signal 111 has memory effects, and linear and nonlinear distortions; and the effects of the memory, linear and nonlinear distortions in the output filtered signal 114 have been reduced, mitigated or eliminated. In some embodiments, the number of parameters typically needed to accomplish the nonlinear filtering scale approximately linearly with the number of symbols that appreciably interact in the memory effects. In this example, the number of each of the parameters $a_i$ and $c_i$ are approximately equal to the number of symbols that appreciably interact in the memory effects, and the number of parameters $b_i$ can be a small number (e.g., from 1 to 10).

To further illustrate the operation of the nonlinear signal filtering system example depicted in FIG. 1A, consider the simple case where only 3 symbols interact in the memory effects, and the nonlinear distortion can be described by a nonlinear relation. The input signal 111 can thus be written as $x_i$, ($x_1$, $x_2$, $x_3$). The first TDL 101 operates on the input signal 111, and the output 112 is described by $$w_i = \Sigma a_i x_i = a_1 x_1 + a_2 x_2 + a_3 x_3. \quad (6)$$

The nonlinear system element 102 performs a nonlinear operation on the output 112, and the output 113 from this element is $y_i$. In this example, the output 113 is described by a nonlinear relation that is a continuous nonlinear function, or a nonlinear function that is piece-wise linear, or a nonlinear polynomial, or a piece-wise nonlinear polynomial, or a LUT. The output 113 from the nonlinear system element 102 will generally contain the cross-terms between different symbols $x_i$ with parameters for each term $b_i$, and thereby will incorporate the nonlinear distortions as well as the memory effects. The output 113 from the nonlinear system element 102 is then processed through the second TDL 103. The output 114 from the second TDL 103 is described by $$z_i = \Sigma c_i y_i = c_1 y_1 + c_2 y_2 + c_3 y_3. \tag{7}$$

The output 114 now contains all of the parameters $a_i$, $b_i$ and $c_i$, including terms containing the cross-terms between symbols $x_i$. In this example, the number of symbols interacting in the memory is 3, and the nonlinear distortions in the signal are described by a relation including parameters $b_i$, and therefore the parameters $a_i$, $b_i$ and $c_i$ can be chosen such that the output 114 of the nonlinear signal filtering system 100 is a filtered signal and the effects of the memory and nonlinearity in the filtered signal 114 have been reduced, mitigated or eliminated.

In the previous example, there were 3 symbols interacting. Suppose that the nonlinear system element had a second order nonlinear relation with one term (i.e., one $b_i$ coefficient was needed to describe the relation). In such a case, the number of parameters needed to filter out the linear and nonlinear distortions, and memory effects, is approximately 7 (i.e., three $a_i$ parameters, plus one $b_i$ coefficient, plus three $c_i$ parameters). In the case of the typical polynomial filtering (e.g., Volterra filtering) 3 to the power of 2, or 9 parameters would need to be defined. In this simple case, the improvement was therefore relatively modest. However, in a situation where 15 symbols are interacting with one another in memory, and the nonlinearity can be described by a third order polynomial, then the number of parameters required in a system using typical polynomial filtering (e.g., Volterra filtering) is approximately 3,375 (i.e., approximately 15 to the power of 3). Using the systems described above, the number of parameters would be approximately 30 to 40 (i.e., 15 $a_i$ parameters, plus fewer than 10 $b_i$ parameters, plus 15 $c_i$ parameters). Therefore, for systems including memory interactions between subsequent symbols in a signal and nonlinear distortions, the systems described herein can reduce the number of parameters required significantly, thereby enabling a practical nonlinear filtering system. Additionally, the systems described herein can operate with a larger number of symbols, and thereby provide better or more thorough distortion correction, than is practical within a Volterra filtering system.

The systems and methods described herein correct signals with nonlinear distortions with or without memory using fewer parameters (e.g., simpler systems that require fewer computations) than conventional systems and methods. In the systems and methods described herein, the number of parameters required to correct signals with nonlinear distortions with memory scales roughly linearly with the sum of the number of symbols interacting in memory and the degree of the nonlinear functions used. This is in contrast to conventional systems and methods for correcting signals with nonlinear distortions with or without memory, wherein the number of parameters required to correct signals with nonlinear distortions with memory scales roughly exponentially with the number of symbols interacting in memory raised to a power roughly equal to the degree of the nonlinear functions used.

In some embodiments, each stage contains from 1 to 5, or from 1 to 10 linear system elements, and from 1 to 5, or from 1 to 10 nonlinear system elements, and the linear system elements and nonlinear system elements within each stage alternate. In some embodiments, the linear system elements contain linear filtering functions, and each linear filtering function has from 1 to N parameters. In some embodiments, the from 1 to N parameters, corresponds to the approximate number of symbols in the signal which interact in memory effects. In some embodiments, the nonlinear system elements contain instantaneous nonlinear filtering functions, and each instantaneous nonlinear filtering function has from 1 to M parameters. In some embodiments, the from 1 to M parameters, correspond to the approximate degree of the instantaneous nonlinear filtering function. In some embodiments, the total number of parameters used in each filtering stage to correct 1) the sample interactions between the plurality of consecutive signal samples in the signal, and 2) the nonlinear distortions in the value of each signal sample, is equal to, or less than the sum of N and M. In other embodiments, there are $X_L$ linear system elements and $X_{NL}$ nonlinear system element in each stage, where $X_L$ is from 1 to 5, or from 1 to 10, and $X_{NL}$ is from 1 to 5, or from 1 to 10. In this case, the total number of parameters used in each filtering stage to correct a signal, is equal to, or less than the sum of $X_L*N$ and $X_{NL}*M$.

In some embodiments, the nonlinear signal filtering system includes several stages, where each stage includes a linear system element followed by a nonlinear system element. In some embodiments, the nonlinear signal filtering system includes from 1 to 10 stages, or includes 1 stage, or 2 stages, or 3 stages, or 4 stages, or 5 stages, or 6 stages, or 7 stages, or 8 stages, or 9 stages, or 10 stages. The linear system elements convolve the input to the element with an impulse response (i.e., scale each symbol in the series by scaling parameters and sum two or more consecutive scaled symbols). The nonlinear system elements transform the output of the preceding linear system element according to a nonlinear function. In some cases, an initial linear or nonlinear system element can be included before the first stage. In some cases, a final linear or nonlinear system element can be included after the last stage. In some cases, each stage contains a nonlinear system element followed by a linear system element. In some cases, each stage can contain three elements: a first linear system element, followed by a nonlinear system element, followed by a second linear system element. Linear filtering system elements in a given stage can include, but are not limited to, tapped delay lines. Nonlinear filtering system elements can include elements that transform the output of the linear system element in a given stage by a continuous nonlinear function, a nonlinear function that is piece-wise linear, a smooth and continuous nonlinear function, or a piece-wise nonlinear function. In some cases, the nonlinear function of the nonlinear filtering element is piece-wise linear and contains many pieces (e.g., greater than 10, or greater than 20, or from 3 to 50). The many pieces can be useful to obtain a close fit to a high-order nonlinear function. The nonlinear element can also transform the output of the linear system element in a given stage using a LUT. In such cases, the transformation need not be described by an explicit mathematical form. In some embodiments, the scaling parameters in the linear system elements, and the nonlinear function (or LUTs) of the nonlinear elements, are chosen to compensate for the symbol interactions (e.g., memory effects) and the nonlinear distortions in symbol amplitude. Each stage in the filtering system adds additional degrees of freedom, allowing the filter to compensate for signals that are affected by symbol interactions (e.g., memory effects) and nonlinear distortions in symbol amplitude requiring many degrees of freedom.

In some embodiments, a nonlinear signal filtering system includes from 1 to 10 system stages connected sequentially or concatenated in series. The nonlinear signal filtering system can filter a signal comprising a series of symbols, where a given symbol in the series is affected by an interaction with one or more consecutive symbols adjacent to the given symbol (i.e., memory effects), and the amplitude of each symbol in the series is subject to nonlinear distortions. The nonlinear signal filtering system can include a first system stage including a first stage linear system element that scales each symbol in the series by scaling parameters and sums two or more consecutive scaled symbols, and a nonlinear system element that transforms the output of the first stage linear system element according to a nonlinear function. Then, each subsequent system stage can include a linear system element that scales the output of the preceding stage by scaling parameters and sums two or more consecutive scaled symbols, and a nonlinear system element that transforms the output of the linear system element in the stage according to a nonlinear function (or LUT). In some cases, an initial linear or nonlinear system element can be included before the first stage. In some cases, a final linear or nonlinear system element can be included after the last stage. In some cases, each stage contains a nonlinear system element followed by a linear system element. In some cases, additional (linear) filtering can be applied at the receiver as a standard part of the signal integrity restoration, to improve the received signal quality. In some cases, each stage can contain three elements: a first linear system element, followed by a nonlinear system element, followed by a second linear system element.

The scaling parameters in all of the linear system elements, and the nonlinear functions (or LUTs) of all of the nonlinear elements, can be chosen to compensate for the symbol interactions and the nonlinear distortions in symbol amplitude in the signal.

Figure 1B:
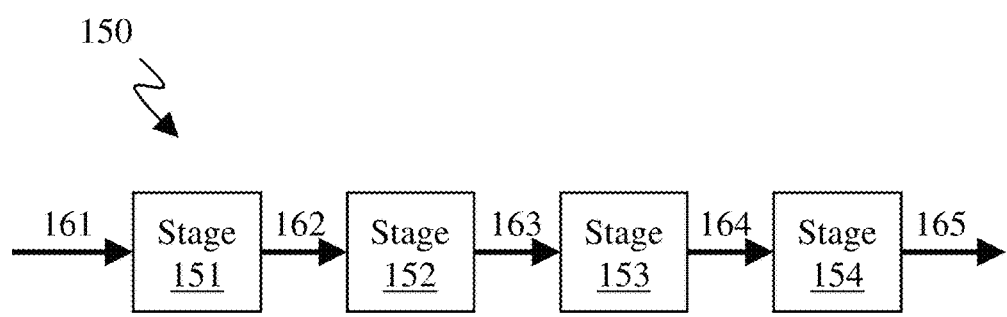
FIG. 1B is a simplified schematic diagram of a nonlinear filtering system, in accordance with some embodiments.

FIG. 1B shows an example of a nonlinear signal filtering system 150 with 4 stages. A signal 161 entering the nonlinear signal filtering system 150 contains a series of symbols, wherein a given symbol in the series is affected by an interaction with one or more consecutive symbols adjacent to the given symbol (e.g., has system memory effects), and the amplitude of each symbol in the series is also subject to nonlinear distortions. A first stage 151 contains a linear system element similar to the TDL 101 in FIG. 1A described above, and a nonlinear system element similar to element 102 in FIG. 1A described above. Similarly, a second stage 152, a third stage 153, and a fourth stage 154 each contain a linear system element and a nonlinear system element, similar to elements 101 and 102 in FIG. 1A described above. In a multistage nonlinear signal filtering system, such as system 150 in FIG. 1B, the output of each stage (e.g., 162, 163, 164 and 165) contains cross-terms including more than one symbol in the signal, which allows the system to compensate for signals with linear and nonlinear distortions, and memory effects. The scaling parameters in the linear system elements in each stage, and the nonlinear functions of the nonlinear elements in each stage, can be chosen to compensate for the symbol interactions and the nonlinear distortions in symbol amplitude in the signal. As described above, an advantage of such a system is that fewer parameters can be used to reduce, mitigate or eliminate the memory and nonlinearity distortions in the signal.

Figure 1C:
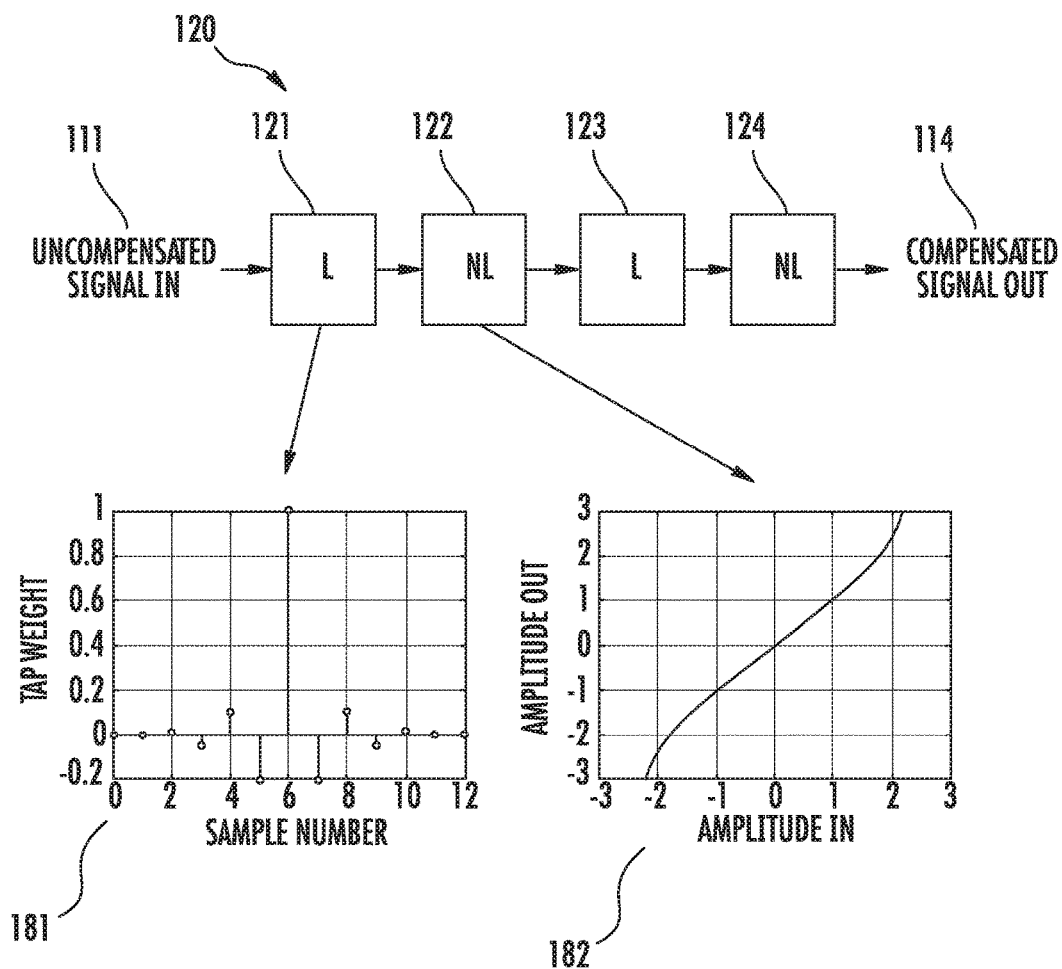
FIG. 1C is a simplified schematic diagram of a nonlinear filtering system, in accordance with some embodiments.

FIG. 1C shows a nonlimiting example of a nonlinear signal filtering system 120 for filtering an input signal 111 to generate an output 114, in accordance with some embodiments. The nonlinear signal filtering system 120 shown in the figure includes a first linear system element or filter (e.g., a TDL) 121, a first nonlinear (NL) system element 122, a second linear system element or filter (e.g., a TDL) 123, and a second nonlinear (NL) system element 124. In this example, the linear system element 121 convolves the input signal 111 with an impulse function. The impulse function is shown in a chart 181, which shows the tap weight on the vertical axis and the sample number on the horizontal axis. In this example, the linear relation described by the chart 181 enables the linear system element 121 to compensate for approximately 12 symbols interacting with a given symbol in memory. The tap weights relate to the parameters used by the linear system element 121. In this example, the nonlinear element 122 uses the relation shown in a chart 182. The amplitude of the input to the nonlinear system element 122 is shown on the horizontal axis and the amplitude of the output from the nonlinear system element 122 is shown on the vertical axis.

In some embodiments, the parameters used by the linear system elements and nonlinear systems elements (e.g., $a_i$, $b_i$, and $c_i$ in the examples above) can be determined using a known input signal with symbols that are affected by linear and nonlinear distortions, with memory effects. The affected signal can be processed by the nonlinear signal filter system, and the parameters used by the linear system elements and nonlinear systems elements can be varied to minimize the error between the output of the nonlinear signal filter system and the unaffected known input signal. Various methods of optimization of the parameters, such that the overall distortion is minimized, can be used in conjunction with the systems described. In some embodiments, the parameters used by the linear system elements and nonlinear systems elements can be determined at system initialization, and/or periodically throughout the system operation. In some embodiments, the parameters used by the linear system elements and nonlinear systems elements can be determined after a predetermined number of symbols have been filtered. In some embodiments, the parameters used by the linear system elements and nonlinear systems elements can be determined after the number of symbols that has been filtered is greater than 10, or greater than 100, or greater than 1000, or greater than $10^6$, or from 10 to $10^4$, or from 10 to $10^5$, or from 10 to $10^6$, or from 10 to $10^9$.

Although the above examples and embodiments describe one dimensional signals, the nonlinear signal filtering systems and methods described above can also be applied to signals that are multidimensional. The same linear system elements and nonlinear system elements can be used as described above to compensate linear, nonlinear amplitude distortions and/or memory effects in multidimensional signals. In some embodiments, the parameters $a_i$ used in the linear system elements can also be real or complex, i.e., one dimensional or multidimensional. In compensation of multidimensional signals, the summing done by the linear system elements can still occur along a single dimension (e.g., when the tap parameters have real, as opposed to imaginary values). One nonlimiting example of a multidimensional signal is a two-dimensional input signal that contains real and imaginary parts. In such a case, the linear system elements processing that signal can have real and/or complex parameters. For the case where the signal has real and imaginary parts, and the linear system element has complex parameters, the systems and methods described herein can compensate for signals with linear and nonlinear distortion, including memory effects and/or interactions between the real and imaginary components of a signal.

Figure 2A:
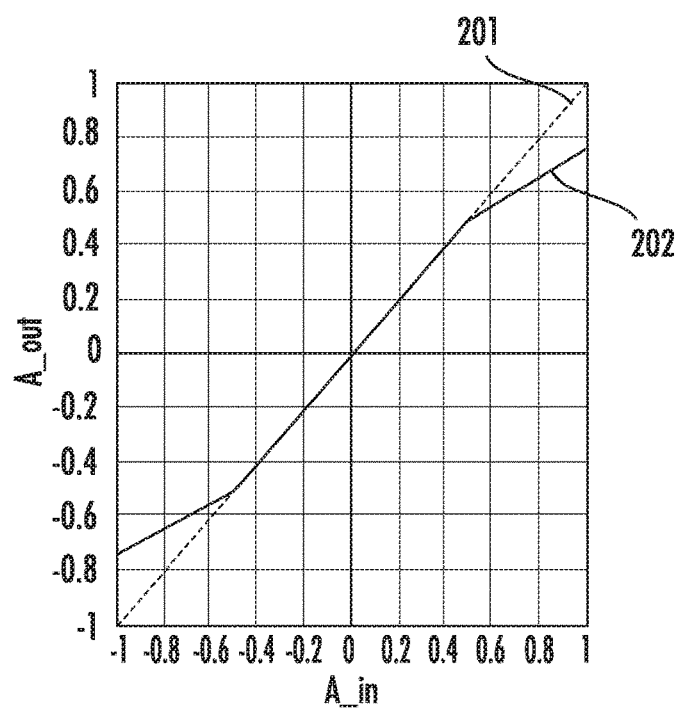
FIG. 2A is a plot of a nonlinear distortion that is described by a piece-wise linear function.
Figure 2B:
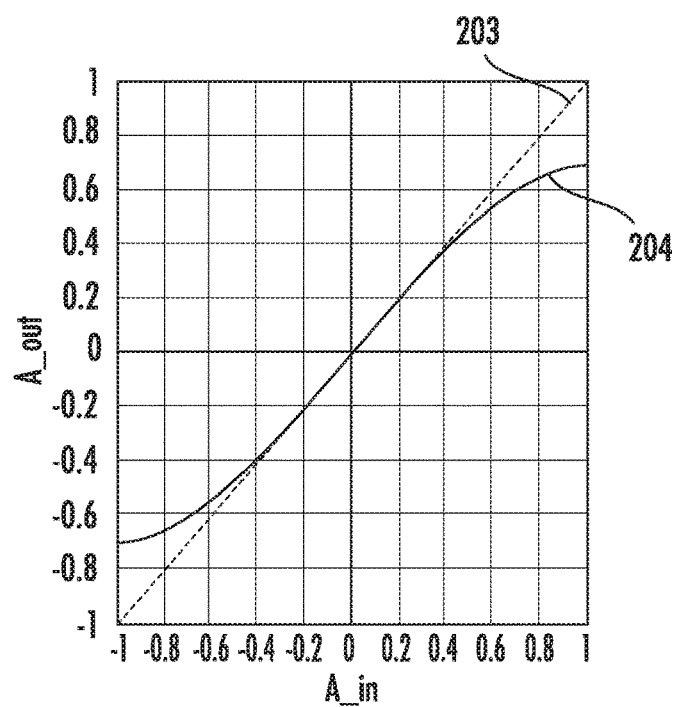
FIG. 2B is a plot of a nonlinear distortion that is described by a nonlinear polynomial.

Some examples of nonlinear distortions are shown in FIGS. 2A and 2B. Some examples of nonlinear distortions are those that occur in the circuitry of an optical transmitter and receiver in a high-speed optical communication system, as well as in other electrical, radio-frequency (RF), or optoelectrical systems.

FIG. 2A shows an example of a nonlinear amplitude distortion that can be described by a piece-wise linear function. The horizontal axis is the amplitude of the input signal, and the vertical axis is the amplitude of the output signal. The dashed line 201 indicates a linear response with no distortion. The solid line 202 shows an example of a saturation (e.g., due to saturation of amplifier components that cannot amplify signals beyond an available power supply level), where the input signal amplitude is above 0.5 and less than −0.5, the amplitude of the output is linearly reduced. A nonlinear system element of the present invention can compensate for this nonlinearity by multiplying the input signal by a function that is piece-wise linear. The parameters of the piece-wise linear function can be chosen to compensate the affected signal and reduce, mitigate or eliminate the nonlinear distortion.

FIG. 2B shows an example of a nonlinear amplitude distortion that can be described by a nonlinear polynomial. The horizontal axis is the amplitude of the input signal, and the vertical axis is the amplitude of the output signal. The dashed line 203 indicates a linear response with no distortion. The solid line 204 shows an example of a saturation, where the output signal amplitude is the input signal amplitude minus 0.3 times the cube of the input signal amplitude, i.e., $A\_out = A\_in - 0.3 \cdot (A\_in)^3$. A nonlinear system element of the present invention can compensate for this nonlinear distortion by multiplying an affected input signal by a function that is the inverse of the nonlinear distortion it experienced. Therefore, the parameters of the inverse function can be chosen to compensate the affected signal and reduce, mitigate or eliminate the nonlinear distortion.

In another example, a nonlinear amplitude distortion can be described by a piece-wise nonlinear polynomial function, where different amplitude ranges are described by different linear and/or nonlinear polynomials.

Methods of Filtering Nonlinear Signals with, or Affected by Memory Effects

Figure 3:
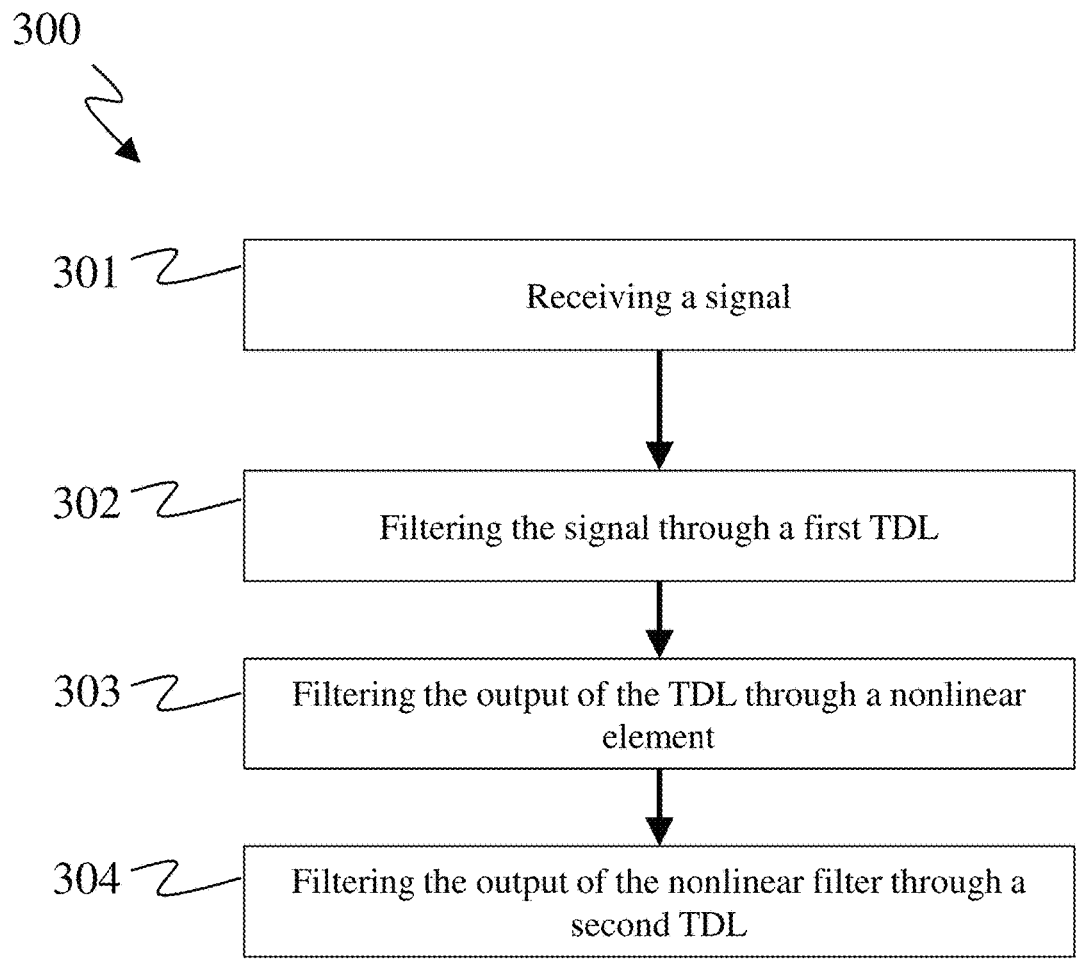
FIG. 3 is a flowchart of a method for filtering a nonlinear signal with memory effects.

A method for filtering a nonlinear signal will now be described. FIG. 3 shows an embodiment of a method 300 for filtering a nonlinear signal. In some embodiments, the method includes receiving (at 301) a signal to be filtered. In some embodiments, the impairments affecting the signal may possess (or include) memory effects, and linear and/or nonlinear amplitude distortions. At 302, the signal is filtered through a first TDL, or a first linear system element. At 303, the output of the first TDL is filtered through a nonlinear filter, or a nonlinear system element. At 304, the output of the nonlinear filter is further filtered through a second TDL, or a second linear system element.

In some embodiments of the method described above, the signal to be filtered includes a series of symbols, wherein each symbol in the series is affected by an interaction with one or more consecutive following and/or preceding symbols adjacent to that symbol (i.e., memory effects or, in the case of communication systems, intersymbol interference), and the amplitude of each symbol in the series is subject to linear and nonlinear distortions. In some embodiments, the signal is then filtered through a first linear system element that convolves each symbol with a first impulse response (i.e., scales each symbol in the series by a scaling coefficient and sums two or more consecutive scaled symbols). The output of the first linear system element is then filtered using a first nonlinear system element that transforms the output of the first linear system element according to a nonlinear function, or transformation. The nonlinear system element can transform the output of the first linear system element by a continuous nonlinear function, or a nonlinear function that is piece-wise linear, or a nonlinear polynomial, or a piece-wise nonlinear polynomial, or a piece-wise nonlinear function, or using a look-up-table (LUT). The output of the first nonlinear system element is then filtered using a second linear system element that convolves the output of the first nonlinear system element with a second impulse response. The scaling parameters in the first and the second linear system elements, and the nonlinear function of the first nonlinear system element, are provided to compensate for the symbol interactions (i.e., memory effects), the linear distortions and the nonlinear distortions in symbol amplitude in the signal.

Figure 4:
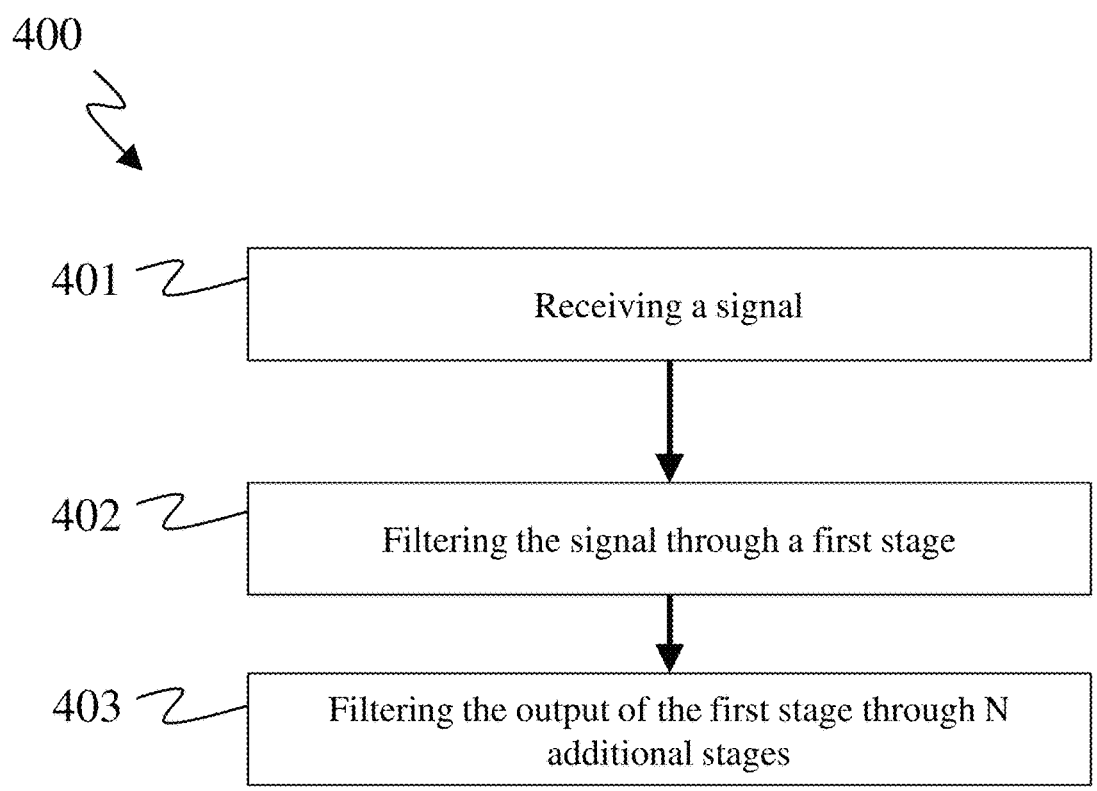
FIG. 4 is a flowchart of a method for filtering a nonlinear signal with memory effects.

A second method for filtering a nonlinear signal will now be described. FIG. 4 shows an embodiment of a method 400 for filtering a nonlinear signal. In some embodiments, the method includes receiving (at 401) a signal to be filtered. In some embodiments, the signal includes memory effects and linear and/or nonlinear amplitude distortions. At 402, the signal is filtered through a first stage. The first stage generally includes a first stage linear system element and a first stage nonlinear system element in series. The signal is first filtered through the linear system element (e.g., a TDL) in the first stage that scales each symbol in the series by a scaling coefficient and sums two or more consecutive scaled symbols. The output of the linear system element in the first stage is then filtered using a nonlinear system element in the first stage that transforms the output of the linear system element according to a nonlinear function. At 403, the signal is filtered through a series of N additional stages. Each additional stage can contain an $n^{th}$ stage linear element and an $n^{th}$ stage nonlinear system element (where n=1 to N). In each of the N stages, the output of the preceding stage (i.e., the $(n-1)^{th}$ stage) is filtered through the linear system element in the $n^{th}$ stage that scales each symbol in the series by a scaling coefficient and sums two or more consecutive scaled symbols. The output of the linear system element in the $n^{th}$ stage is then filtered using a nonlinear system element in the $n^{th}$ stage that transforms the output of the linear system element according to a nonlinear function. In some cases of this method, an initial linear or nonlinear system element can be included before the first stage, and/or a final linear or nonlinear system element can be included after the last stage. In some cases of this method, the order of the elements can be exchanged, and each stage can contain a nonlinear system element followed by a linear system element. In some cases of this method, each stage can contain three elements: a first linear system element, followed by a nonlinear system element, followed by a second linear system element. The scaling parameters in all of the linear system elements, and the nonlinear functions of all of the nonlinear system elements, can be provided to compensate for the symbol interactions (i.e., memory effects), the linear distortions, and the nonlinear distortions in symbol amplitude in the signal.

As described above, the linear system elements in the first stage and in the N additional stages can be a TDL, that convolves each symbol with an impulse response. Also, as described above, the nonlinear system elements in the first stage and in the N additional stages can transform the output of the first linear system element by a continuous nonlinear function, or a nonlinear function that is piece-wise linear, or a nonlinear polynomial, or a piece-wise nonlinear polynomial, or using a look-up-table (LUT).

In some embodiments, the first and/or the second nonlinear signal filtering method described above can be used to pre-compensate for a signal. In such methods, an input signal can be filtered through the nonlinear signal filtering methods described above before the nonlinear distortions and memory effects occur. Then, the pre-compensated signal can be transmitted through the system incurring the linear and nonlinear distortions and memory effects before being received. In this case, the linear and nonlinear distortions and memory effects present in the received signal would be reduced, mitigated or eliminated by the pre-compensation.

Alternatively, the first and/or the second nonlinear signal filtering method described above can be used to post-compensate a signal. In such methods, an input signal can be transmitted through the system incurring linear and nonlinear distortions and memory effects before being received. Then, at the receiver, the affected signal can be filtered through the nonlinear signal filtering methods described above. In this case, the linear and nonlinear distortions and memory effects present in the received signal would be reduced, mitigated or eliminated by the post-compensation. In some embodiments, the first and/or the second nonlinear signal filtering method described above can be used to both pre-compensate and post-compensate a signal.

Examples

Figure 5A:
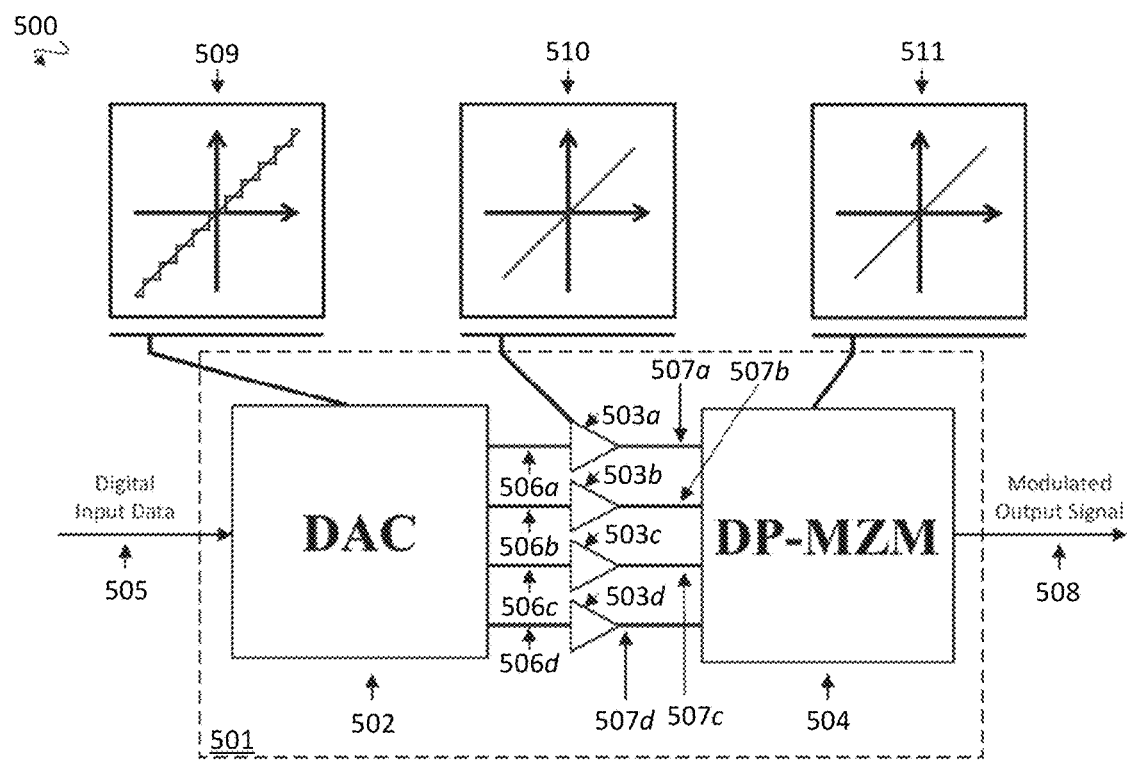
FIG. 5A is a simplified schematic of an optical transmitter and ideal signal characteristic graphs.
Figure 5B:
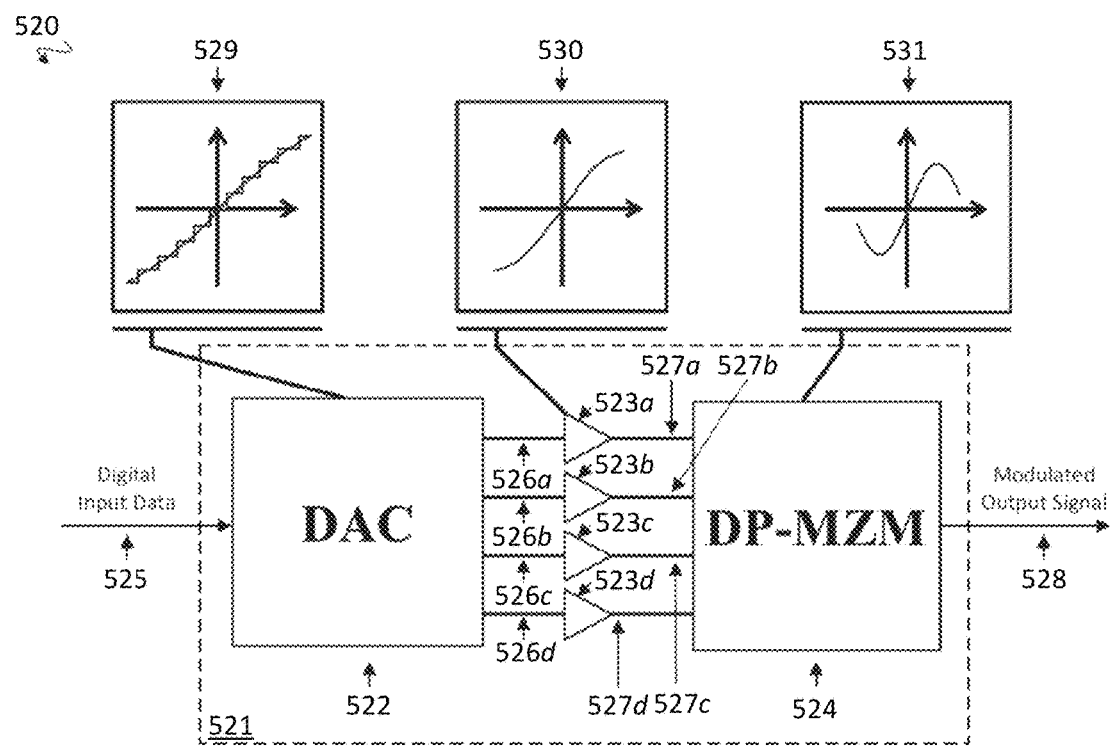
FIG. 5B is a simplified schematic of an optical transmitter and non-ideal signal characteristic graphs.

Example 1: Compensation of Nonlinear Distortion with Memory in Optical Communication Systems An example of a system where signals are affected by nonlinear distortions with memory is an optical communication transmission system. FIGS. 5A and 5B show two examples of portions of an optical communication transmission system. FIG. 5A shows a portion of a system with components that all have linear responses, while FIG. 5B shows a portion of a system with components that have non-linear responses.

FIG. 5A shows a related art optical transmitter 501 and ideal signal characteristic graphs 509 through 511. The optical transmitter 501 is part of an optical transmission system 500. Some elements are omitted for ease of illustration and explanation.

As shown, the optical transmitter 501 includes a digital-to-analog converter (DAC) circuit 502 coupled to amplifier circuits 503a-d. The amplifier circuits 503a-d are coupled to a dual-parallel Mach-Zehnder modulator (DP-MZM) circuit 504. In some embodiments, the amplifiers 503a-d are radio frequency amplifiers.

The DAC circuit 502 receives digital input data 505 and generates analog signals 506a-d, which are analog representations of the digital input data 505. In some embodiments of this example, the analog signals 506a-d are symbols of a quadrature-amplitude modulation (QAM) scheme, where each symbol represents a state of a carrier signal, the state having a specific phase, amplitude and frequency. In some embodiments of this example, a first pair of analog signals, 506a-b, represent the in-phase and quadrature components of a first QAM signal, and a second pair of analog signals, 506c-d, can represent the in-phase and quadrature components of a second QAM signal.

The analog signals 506a-d are received by the amplifier circuits 503a-d which amplify the analog signals 506a-d to generate amplified signals 507a-d. The amplified signals 507a-d are received by the DP-MZM circuit 504, which can imprint (e.g., modulate) the electrical information from the amplified signals 507a-d onto a dual-polarized optical carrier signal to generate a modulated optical output signal 508. In some embodiments of this example, information from the first QAM signal (corresponding to the amplified signals 507a-b) is imprinted onto a first polarization of the dual-polarized optical carrier signal (e.g., the X-polarization), and information from the second QAM signal (corresponding to the amplified signals 507c-d) is imprinted onto a second polarization of the dual-polarized optical carrier signal (e.g., the Y-polarization).

Graphs 509, 510, and 511 have the input signal amplitude on the horizontal axes, and the output signal amplitude on the vertical axes. Graph 509 of FIG. 5A shows an example analog output signal from the DAC circuit 502 (e.g., the analog signal 506a-d) based on the digital input data 505, and is represented by a digital step function graph. The analog output signal shown as a continuous line in graph 509 has an ideal quantization characteristic. The output of the DAC circuit in graph 509 is a quantized (or discretized) transformation of the ideal linear relationship. Graph 510 shows an example amplified output signal from an amplifier circuit of the amplifier circuits 503a-d. The amplified output signal shown has an ideal linear amplitude characteristic. Graph 511 shows an example modulated output signal from the DP-MZM circuit 504. The modulated output signal shown has an ideal linear amplitude characteristic.

In contrast to the optical transmitter 501 of FIG. 5A, FIG. 5B shows a related art optical transmitter 521 and non-ideal signal characteristic graphs 529 through 531. The optical transmitter 521 is part of an optical transmission system 520. Some elements are omitted for ease of illustration and explanation.

As shown, the optical transmitter 521 includes a DAC circuit 522 coupled to amplifier circuits 523a-d. The amplifier circuits 523a-d are coupled to a DP-MZM circuit 524. In some embodiments, the amplifiers 523a-d are radio frequency amplifiers.

The DAC circuit 522 receives digital input data 525 and generates analog signals 526a-d, which are analog representations of the digital input data 525. The analog signals 526a-d are received by the amplifier circuits 523a-d, which amplify the analog signals 526a-d to generate amplified signals 527a-d. The amplified signals 527a-d are then received by the DP-MZM circuit 524, which imprints information from the amplified signals 527a-d onto a dual-polarized optical carrier signal to generate a modulated output signal 528. In some embodiments, the analog signals 526a-d are symbols of a QAM modulation scheme as was discussed with reference to FIG. 5A.

Due to non-idealities in the DAC circuit 522, the amplifier circuits 523a-d and the DP-MZM circuit 524, information extracted from the modulated output signal 528 may differ significantly from the information contained in the digital input data 525. Such non-idealities include nonlinearity, saturation, compression and system memory effects. Graphs 529, 530, and 531 have the input signal amplitude on the horizontal axes, and the output signal amplitude on the vertical axes. In the example shown in FIG. 5B, graph 529 shows an example analog output signal (e.g. the analog output signal 526a) generated by the DAC circuit 522 based on the digital input data 525, which is represented by a digital step function graph. Graph 530 shows an example amplified output signal from an amplifier circuit of the amplifier circuits 523a-d. Graph 531 shows an example modulated output signal that is output from the DP-MZM circuit 524.

Figure 5C:
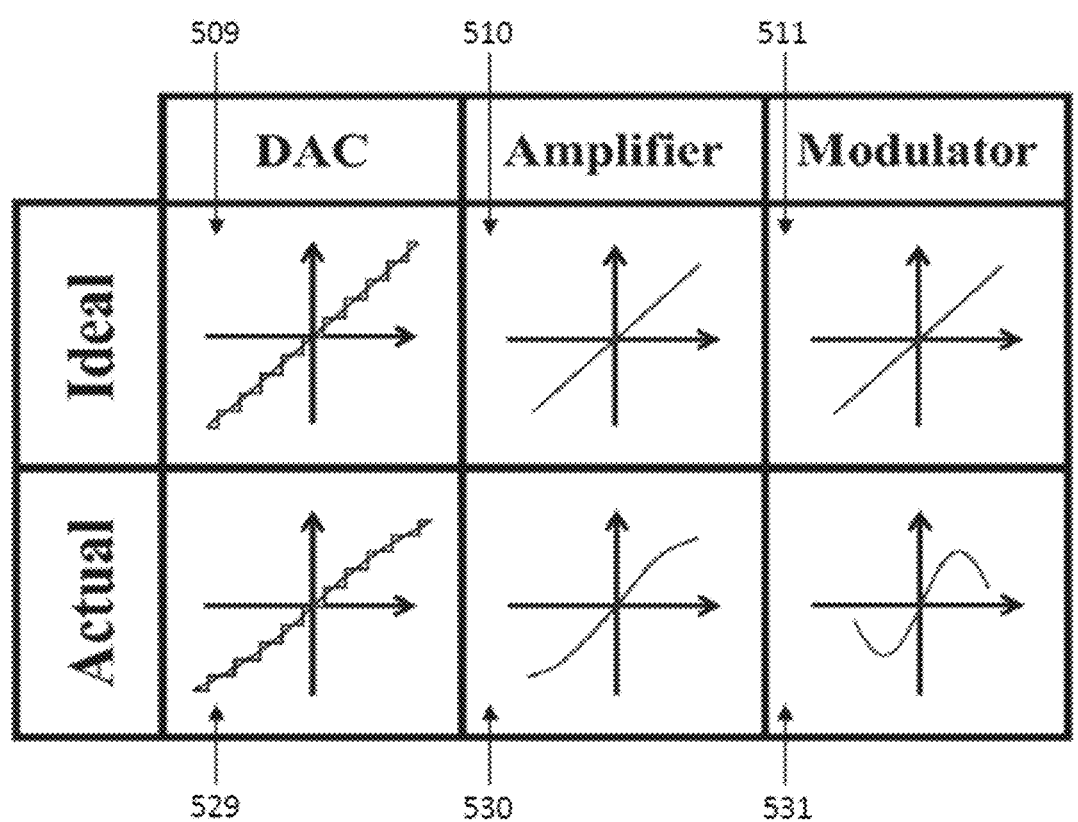
FIG. 5C shows simplified graphs that illustrate a difference between ideal and non-ideal signal characteristics.

The differences between signals of the optical transmitter 501 (having ideal signal characteristics) and the optical transmitter 521 (having non-ideal and nonlinear signal characteristics) are summarized in FIG. 5C. FIG. 5C shows the differences between ideal and non-ideal ("actual") signal characteristics side-by-side for the graphs in FIGS. 5A and 5B. As shown, the analog output signal 529 has a non-ideal quantization, and a nonlinearly distorted amplitude characteristic, as compared to the ideal quantization and undistorted amplitude characteristic of the analog output signal graph 509. The amplified output signal graph 530 shows a reduction in gain due to nonlinearities in the amplifier circuitry which can cause gain compression and/or saturation, as compared to the ideal line of the amplitude output signal graph 510. The modulated output signal graph 531 has a non-ideal sinusoidal amplitude characteristic, as compared to the ideal straight line of the modulated output signal graph 511.

In addition to the nonlinear amplitude distortions caused by the components in the optical transmitter system in this example, some components can also cause memory effects. For example, the DP-MZM (e.g., element 524 in FIG. 5B) can cause memory effects, where a given signal amplitude is affected by one or more symbols surrounding the given symbol. The DP-MZM 524 is therefore an example of a component that can cause both linear and nonlinear amplitude distortion, and both can include memory effects.

Figure 5D:
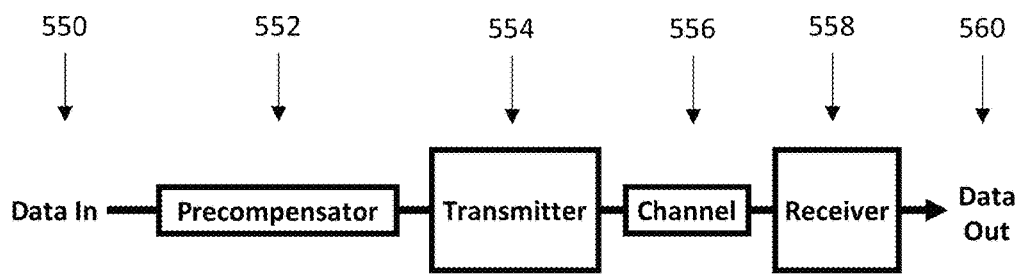
FIGS. 5D and 5E show simplified schematics of a nonlinear filtering system in pre-compensation and post-compensation configurations, respectively, in accordance with some embodiments.
Figure 5E:
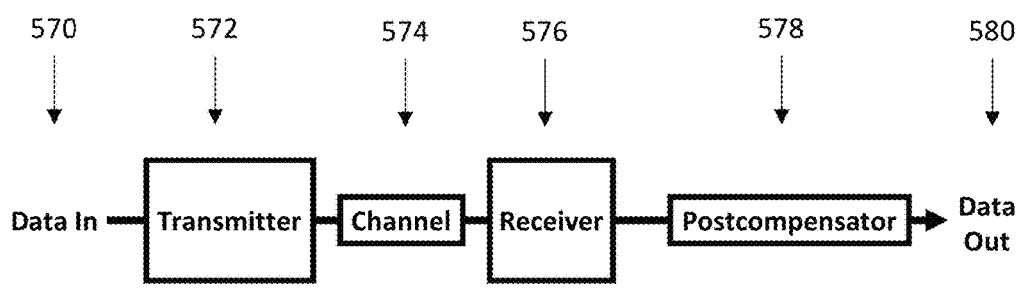

In this example, the nonlinear filtering system described above can be used to reduce, mitigate or eliminate the memory and nonlinear distortions in the signal. The nonlinear filtering system can reduce, mitigate or eliminate the memory and nonlinear distortions in the signal before transmission through a channel (i.e., in a pre-compensation scheme), or after a signal has been transmitted through the channel and received in a receiver (i.e., in a post-compensation scheme). FIG. 5D shows a simplified schematic of a nonlinear filter pre-compensation scheme in a communication system, and FIG. 5E shows a simplified schematic of a nonlinear pre-compensation scheme in a communication system. Referring to FIG. 5D, input data 550 is pre-compensated by a nonlinear filter ("precompensator") 552 as described herein, before being transmitted by a transmitter 554 through a channel 556. The signal is received at a receiver 558, and the memory and nonlinear distortions in output data 560 have been reduced, mitigated or eliminated at least partially as a result of the nonlinear filter of the precompensator 552. Referring to FIG. 5E, on the other hand, input data 570 is transmitted by a transmitter 572 through a channel 574. The signal is received at a receiver 576, and is post-compensated by a nonlinear filter ("postcompensator") 578 as described herein, such that the memory and nonlinear distortions in output data 580 have been reduced, mitigated or eliminated at least partially as a result of the nonlinear filter of the postcompensator 578. In some embodiments, both pre-compensation and post-compensation can be used, for example, by adding a postcompensator element (similar to the postcompensator 578 in FIG. 5E) between the receiver 558 and the output data 560 in FIG. 5D.

In some embodiments, the nonlinear signal filtering system in this Example includes a first linear system element, a nonlinear system element, and a second linear system element (similar to the nonlinear signal filtering system 100 shown in FIG. 1A, and described throughout). The first linear system element is a TDL that convolves the signal with an impulse response. The nonlinear system element transforms the output of the first linear system element according to an instantaneous nonlinear function to compensate for the nonlinearity incurred by the signal. Then, the second linear system element convolves the outputs from the nonlinear element with an impulse response. The combination of the linear system elements and nonlinear system element allows this filter to compensate for both nonlinearities (e.g., caused by the DAC 522, the amplifiers 523a-d and the DP-MZM 524), and memory effects (e.g., caused by the DP-MZM 524), using a system with a relatively small number of parameters describing the relations used by the linear and nonlinear elements.

In this example, it is possible to compensate for the nonlinear amplitude distortions and the memory effects by pre-compensating the input signal (e.g., the digital input data 525 in FIG. 5B) to account for the nonlinear distortions and the memory effects caused in the transmitter (e.g., 521 in FIG. 5B). It is also possible to compensate for the nonlinear amplitude distortions and the memory effects by post-compensating the received signal at the receiver.

Example 2: Nonlinear Signal Compensation

Figure 6A:
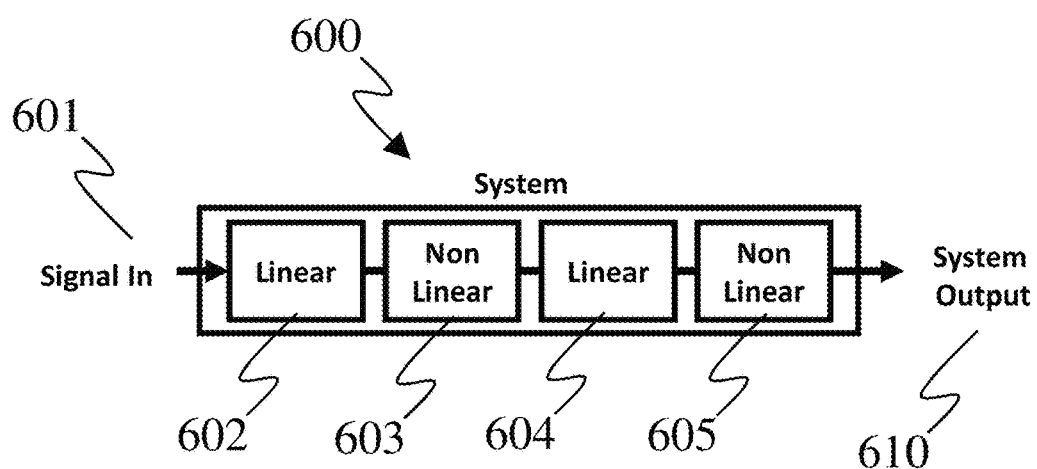
FIG. 6A is simplified schematic of a system with input and output plots without equalization.
Figure 6A:
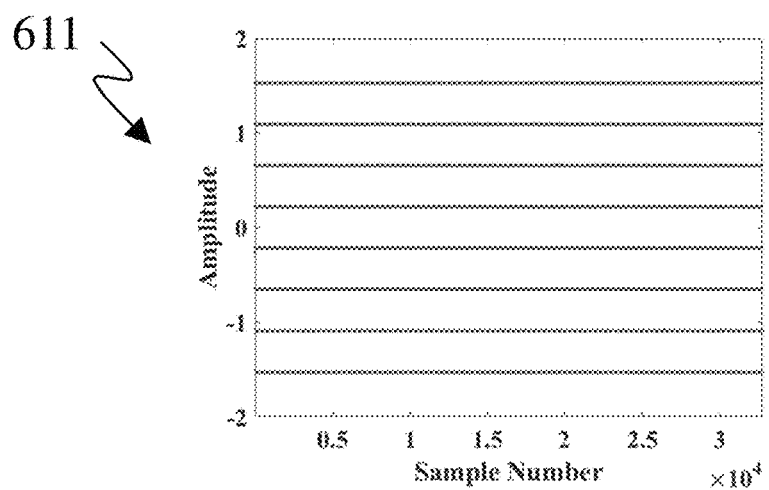
Figure 6A:
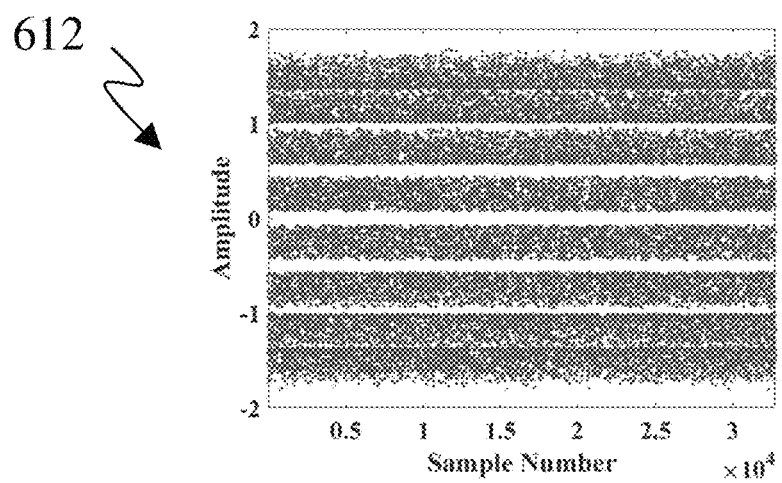

In this example, an input signal is subjected to linear and nonlinear distortion with memory effects, and then compensated to recover the original signal using a nonlinear signal filtering system. FIG. 6A shows a system 600 with an element 602 that induces linear distortion (e.g., with three-tap memory), an element 603 that causes a nonlinear distortion (e.g., with a cubic polynomial response), a second element 604 that induces linear distortion (e.g., with three-tap memory), and an element 605 that causes a nonlinear distortion (e.g., with a cubic polynomial response). Elements 602, 603, 604 and 605 also induce distortions that include memory effects. Plots 611 and 612 of the Signal In 601 and the System Output without Equalization 610, respectively, have the number of samples (i.e., symbols) of the signal along the horizontal axes and the amplitude of each symbol in the signal on the vertical axis. The Signal In 601 has 8 levels that are clearly distinguishable in the plot 611. After passing through the system 600, the System Output 610 has been affected by the nonlinear distortions and linear distortions, each with memory effects, which manifest as vertical scatter in the plot 612 of the System Output 610 for each symbol.

Figure 6B:
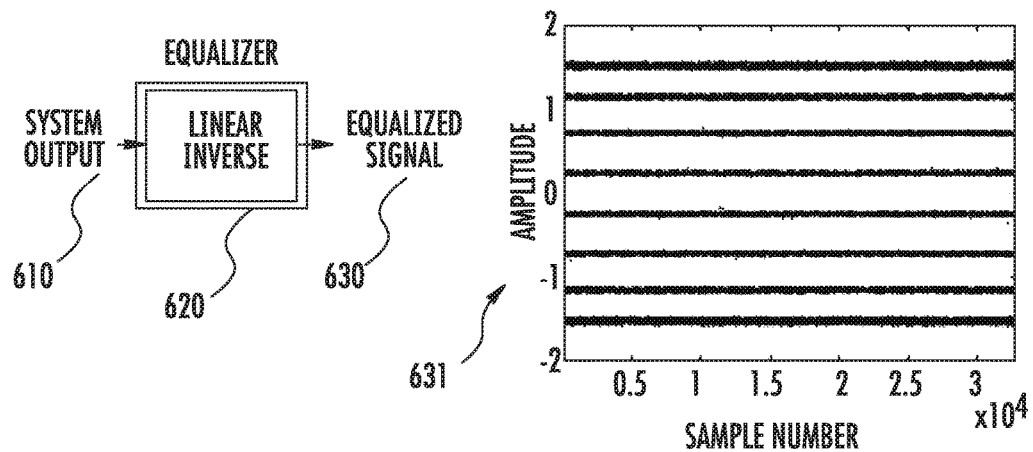
FIG. 6B is a simplified schematic of an equalizer with an output plot with only linear equalization.

FIG. 6B shows the System Output 610 processed by an Equalizer 620 to obtain an Equalized Signal 630, as illustrated in plot 631. In this case, the Equalizer 620 contains a single linear system element, such as a TDL, capable of convolving the input (i.e., the System Output 610) with an impulse response. The linear system element in the Equalizer 620 has a linear response with 11-tap memory that is approximately the inverse of the linear distortion caused by elements 602 and/or 604. After being partially compensated by the Equalizer 620, the Equalized Signal 630 (plot 631) in this case shows less noise than the System Output 610 (plot 612), but some distortion (i.e., variance in the amplitude) remains in each of the levels.

Figure 6C:
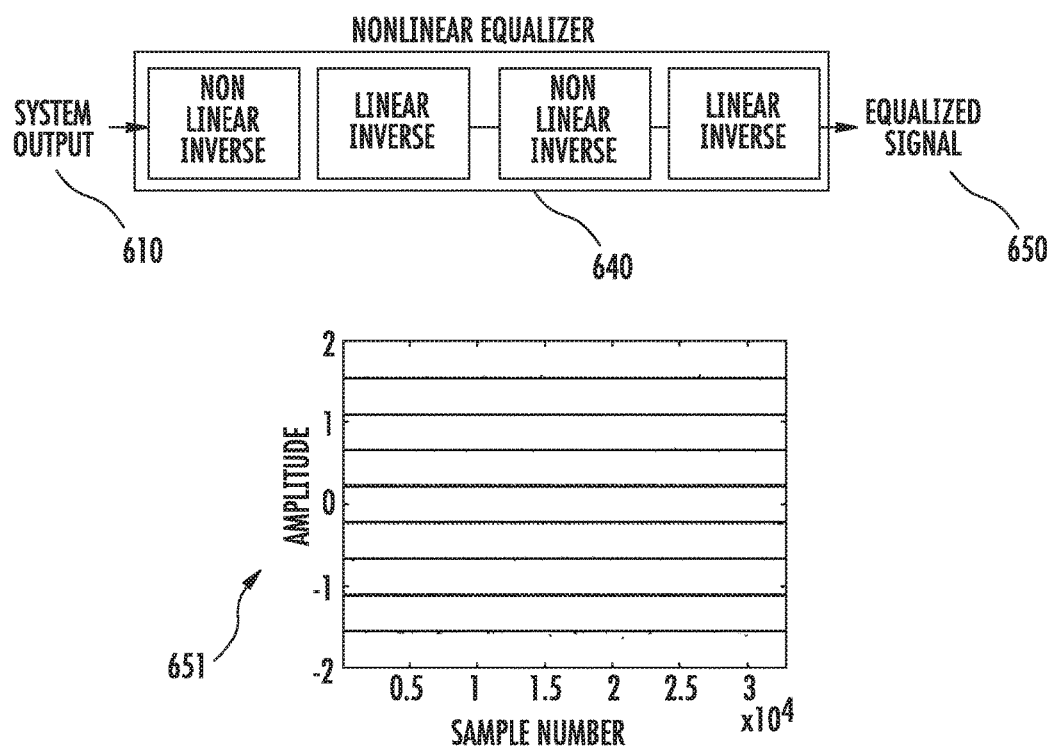
FIG. 6C is a simplified schematic of an equalizer with an output plot with linear and nonlinear equalization.

FIG. 6C shows the System Output 610 processed by an Equalizer 640 to obtain an Equalized Signal 650, as illustrated in plot 651. In this case, the Equalizer 640 contains a first linear system element capable of convolving the input with an impulse response (e.g., a first TDL), a first nonlinear system element, a second linear system element capable of convolving the input with an impulse response (e.g., a second TDL), and a second nonlinear system element. The linear and nonlinear system elements with memory in the Equalizer 640 have linear and nonlinear responses with their response functions and parameters chosen to compensate for the linear and nonlinear distortions with memory effects caused by the combination of linear and nonlinear distortion elements with memory 602, 603, 604 and 605, wherein the linear inverse blocks consist of 11-tap memory filters, and the nonlinear inverse blocks consist of $5^{th}$ order polynomials. For example, the linear system element can be a TDL with the number of taps needed to account for the number of interactions (interaction length) between symbols in the signal, and the tap weights chosen to offset any linear distortions in the signal. The response functions of the nonlinear system elements, for example, can approximate the inverse functions of one or more nonlinear components of the noise in the signal. After being compensated by the Equalizer 640, the Equalized Signal 650 in this case closely resembles the System Output 610, as shown in the plot 651.

Example 3: Nonlinear, Volterra and Memory Polynomial Signal Compensation

Similar to Example 2, in this Example an input signal was subjected to linear and nonlinear distortion with memory effects, and then compensated to recover the original signal using a nonlinear signal filtering system. The performance of the nonlinear filtering system (i.e., nonlinear equalizer) described herein was compared to conventional Volterra compensation and Memory Polynomial compensation (i.e., conventional equalizers).

Figure 7A:
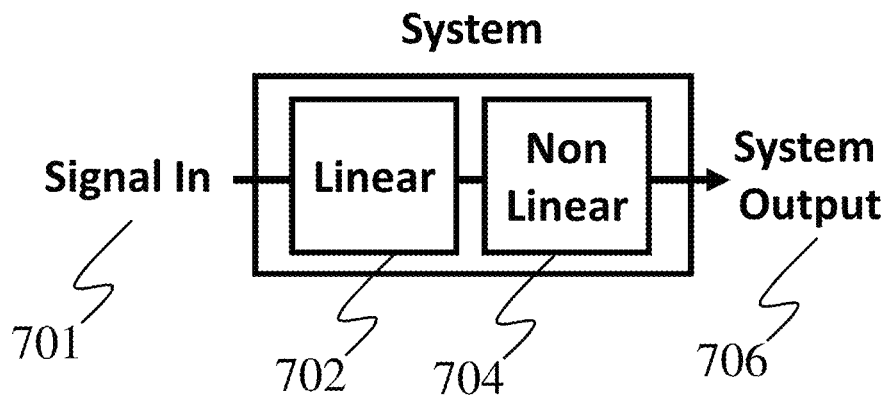
FIG. 7A is a simplified schematic of a system in which linear and nonlinear distortions are introduced.

FIG. 7A shows the system that introduced the linear and nonlinear distortions, with the memory effects (elements 702 and 704) onto an input signal 701 and produced a distorted system output 706.

Figure 7B:
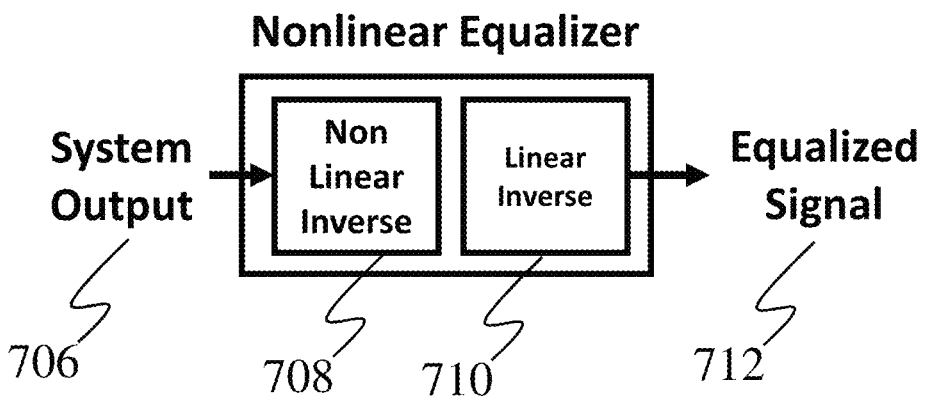
FIG. 7B is a simplified schematic of a nonlinear filtering system (equalizer) in accordance with some embodiments.

FIG. 7B illustrates the nonlinear filtering system, described in detail throughout this disclosure, which contained a nonlinear filtering element 710 and a linear filtering element 710. The distorted system output 706 was fed into the nonlinear equalizer producing an equalized signal 712. In this case, the linear filtering element 710 was a tapped delay line containing about 10 taps and approximated the inverse operation of the system element 702 that introduced the linear distortion with memory. In this case, the nonlinear filtering element 708 approximated the inverse operation of the system element 704 that introduced the nonlinear distortion with memory. In this case, the inverse operation of the nonlinear distortion was best approximated by a piecewise continuous function, not a continuous single polynomial across the amplitude range of interest. Note also that the arrangement sequence of the linear element 710 and the nonlinear element 708 in the equalizer (i.e., linear element 710 is after the nonlinear element 708) is the reverse of the arrangement sequence in the system shown in FIG. 7A (i.e., linear element 702 is before the nonlinear element 704).

Figure 7C:
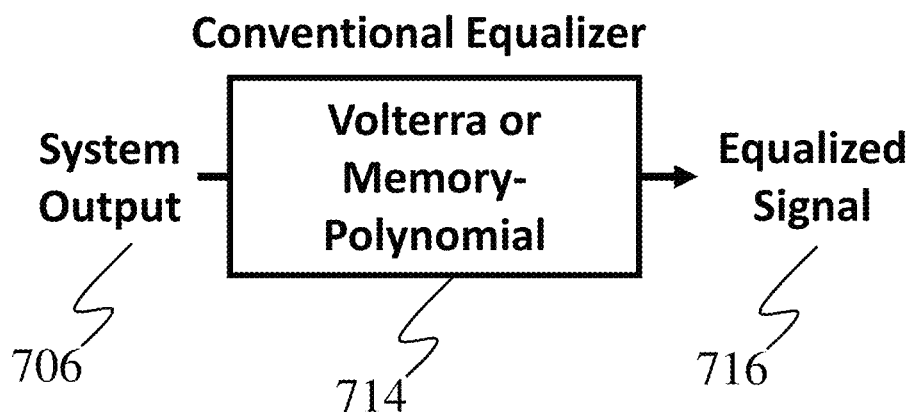
FIG. 7C is a simplified schematic of a prior art Volterra or Memory Polynomial equalizer.

FIG. 7C shows the Volterra or Memory Polynomial equalizer arrangement. In both cases the distorted system output 706 was fed into the conventional equalizer 714 producing an equalized signal 716. In this Example, the Volterra equalizer 714 utilized a $5^{th}$ order Volterra series with about 30 taps. In this Example, the Memory Polynomial equalizer 714 also utilized a $5^{th}$ order Volterra series with about 30 taps, but only included the diagonal matrix elements and omitted all terms with cross-products.

Figure 8A:
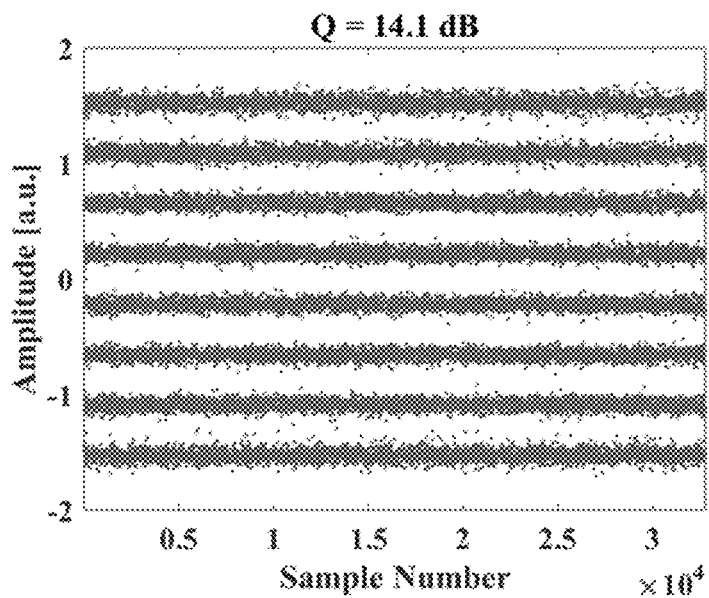
FIG. 8A shows an equalized signal obtained using a prior art Volterra equalizer.
Figure 8B:
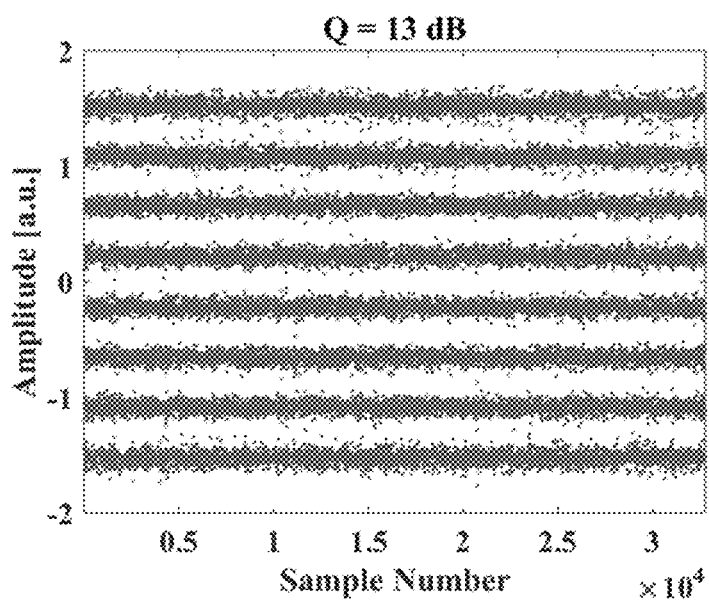
FIG. 8B shows an equalized signal obtained using a prior art Memory Polynomial equalizer.
Figure 8C:
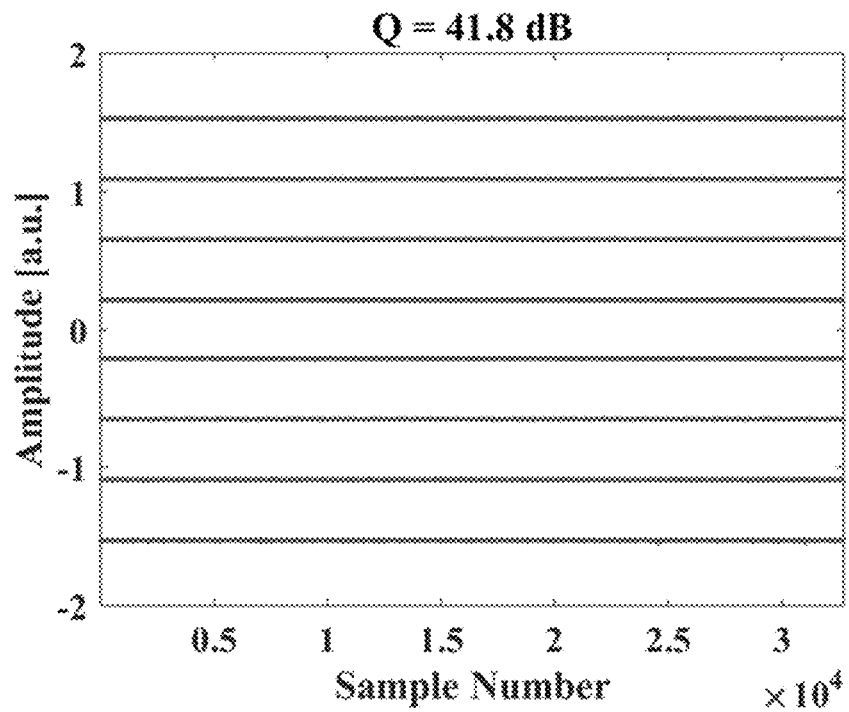
FIG. 8C shows an equalized signal obtained using a nonlinear filtering system (equalizer) in accordance with some embodiments.

FIGS. 8A-8C show the equalized signals obtained using each of the three equalizers. FIG. 8A shows the equalized signal 716 obtained using the conventional Volterra equalizer. Significant noise remained in the signal which was not mitigated using the conventional Volterra equalizer, and the Q was approximately 14.1 dB. This illustrates that even though the Volterra series is very effective at mitigating certain types of nonlinear distortions with memory, there are types of nonlinear distortions that Volterra is not capable of mitigating, such as distortions that cannot be well described by a continuous polynomial (e.g., those containing piecewise continuous functions, or look-up tables).

FIG. 8B shows the equalized signal 716 obtained using the conventional Memory Polynomial equalizer. Significant noise remained in the signal which was not mitigated using the conventional Memory Polynomial equalizer, and the Q in this case was slightly worse than that obtained using the full Volterra equalizer, approximately 13 dB. This illustrates again, that equalization based on the Volterra series can be effective at mitigating certain types of nonlinear distortions with memory, but cannot mitigate other types of distortions such as those containing piece-wise continuous functions that are not able to be well described by continuous $5^{th}$ order polynomials.

FIG. 8C shows the equalized signal 712 obtained using the nonlinear equalizer described herein. The distortion reduction was greatly improved over both of the conventional equalizers, and the Q in this case was greater than 40 dB. This illustrates that equalization based on the nonlinear equalizer described herein can be effective at mitigating many types of nonlinear distortions with memory, including those types that cannot be well handled using conventional systems.

Example 4: Multiple-Input Multiple-Output Nonlinear Signal Compensation

In this Example, a nonlinear filtering system (i.e., nonlinear equalizer) similar to that described in Example 2 (FIG. 6C element 640) is capable of processing multiple input signals to produce multiple output signals. Such an equalizer can be described as a multiple input multiple output (MIMO) equalizer.

Figure 9A:
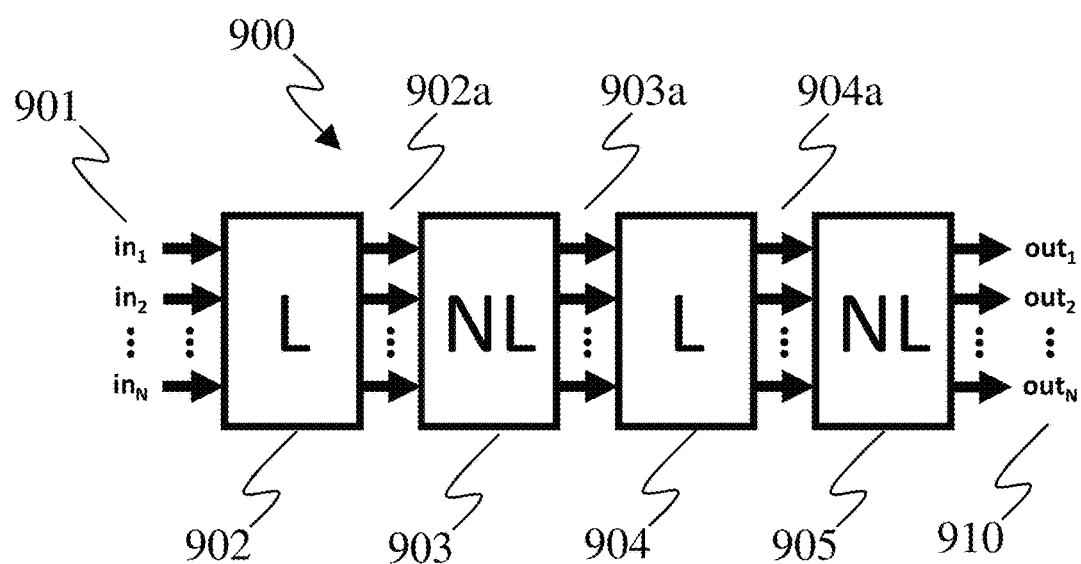
FIG. 9A is a simplified schematic of an example of a MIMO nonlinear equalizer in accordance with some embodiments.

FIG. 9A shows an example of a MIMO nonlinear equalizer 900. The multiple input signals 901 are processed by linear and nonlinear filter elements (902, 903, 904 and 905) to produce the multiple output signals 910. Each filtering element 902, 903, 904 and 905 process input signals to produce output signals 902a, 903a, 904a and 910, respectively. In this example, the linear and nonlinear elements alternate, and a linear filtering element 902 is connected to a nonlinear filtering element 903, which is connected to a linear filtering element 904, which is connected to a nonlinear filtering element 905.

The input signals 901, $in_1$, $in_2$, ... $in_N$, can each be scalar quantities or vectors. For example, the signals could be vectors containing multiple instances of the signal in time and therefore include system memory effects. The intermediate signals 902a, 903a, 904a and the output signals 910 can also each be scalar quantities or vectors.

Additionally, the number of input signals to any element can be the same or different than the number of signals at the output of that element. In other words, the number of signals contained in each of the signals 901, 902a, 903a and 904a, and 910 can contain the same number of signals or different numbers of signals. In the MIMO systems described in this Example, the number of signals (e.g., "N" for the input signals 901, and/or the output signals 910) can be between 1 and 1000.

Figure 9B:
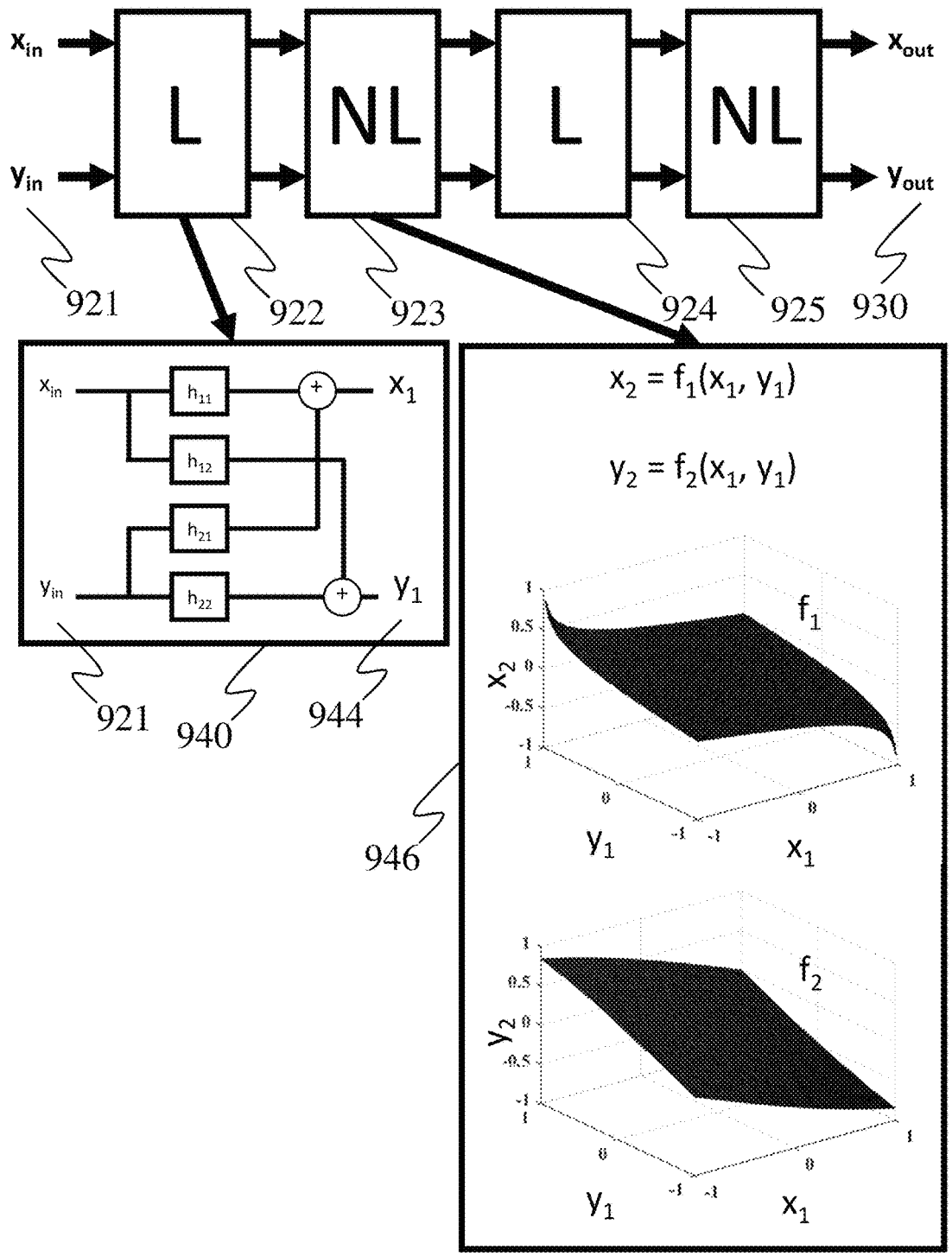
FIG. 9B is a simplified schematic of another example of a MIMO nonlinear equalizer with example functions incorporating nonlinear cross-coupling, in accordance with some embodiments.

FIG. 9B shows another example of a MIMO nonlinear equalizer, in which there are 2 input signals 921, and 2 output signals 930. The equalizer includes alternating linear and nonlinear elements 922, 923, 924 and 925.

The linear element 922 in this Example, includes a particular interaction between the input signals 921 ($x_{in}$ and $y_{in}$) to the element 922 and the output signals 944 ($x_1$ and $y_1$) from the element 922 including cross-coupling between the different input signals ($x_{in}$ and $y_{in}$). The interaction is shown in inset 940, where different components of the input signal $x_{in}$ are multiplied by different parameters $h_{11}$ and $h_{12}$, and different components of the input signal $y_{in}$ are multiplied by different parameters $h_{21}$ and $h_{22}$. The differently scaled components are then added such that cross-coupling of the input signals is included, and the signal component multiplied by coefficient $h_{11}$ is added to the component multiplied by coefficient $h_{21}$ to produce output signal $x_1$, and the signal component multiplied by coefficient hie is added to the component multiplied by coefficient $h_{22}$ to produce output signal $y_1$. Some examples of different components in electrical and optical systems are the real and imaginary components of an electrical signal, different polarizations of an optical signal, or the in-phase and quadrature components of a QAM signal.

In this Example, the nonlinear element 923 includes a particular interaction between the input signals ($x_1$ and $y_1$) to the nonlinear element 923 and the output signals ($x_2$ and $y_2$) from the nonlinear element 923. In this Example, the nonlinear element 923 operates on the input signals ($x_1$ and $y_1$) using functions $f_1$ and $f_2$ to produce the output signals ($x_2$ and $y_2$). Each of the functions $f_1$ and $f_2$ operate on both input signals $x_1$ and $y_1$, thereby incorporating nonlinear cross-coupling between the different input signals. The inset 946 in FIG. 9B shows two example functions for $f_1$ and $f_2$, including cross-coupling between the input signals.

The input signals 921 $x_{in}$ and $y_{in}$ and the output signals 930 $x_{out}$ and $y_{out}$ can each be scalar quantities or vectors. For example, the signals could be vectors containing multiple instances of the signal in time and therefore include system memory effects.

Example 5: Nonlinear Signal Filtering System Including Look-Up-Tables

In this example, an input signal is subjected to linear and nonlinear distortion with memory effects, and then compensated to recover the original signal using a nonlinear signal filtering system including a nonlinear system element implemented as, or utilizing, a look-up-table.

Using the systems and methods described in this Example, high-speed optical transmission systems can achieve better performance, realize longer reach, and provide a high degree of reproducibility of information bearing waveforms. As a result, improved generation of modulation formats of high cardinality can be achieved, resulting in transmission signals having a high density of information packing, and/or high spectral efficiency. Such improvements can be achieved using a composition that combines the capabilities of linear equalization and nonlinear transmitter equalization and further takes system memory effects into account. Additionally, these improvements can be achieved without requiring significant modifications in existing optical transmission technology and the manufacturing process of the optical transmitters.

Additionally, the systems and methods in this Example can be extended to correct impairments due to cross-talk between the transmitter polarizations in the transmitter. In some embodiments, both the linear and nonlinear response of the transmitter are jointly corrected, including the associated linear and nonlinear response and system memory effects. Joint correction can occur at both ends of the transmission system (transmission/reception).

In accordance with some embodiments, therefore, systems and methods in this Example are described for using pre-compensation to reduce, mitigate or eliminate ("correct") impairments due to nonlinear effects and system memory effects in optical transmission systems. In some embodiments, pre-compensation can be performed by considering multiple time instances, rather than only a single time instant, thereby characterizing and correcting for system memory effects of an optical transmission system in addition to correcting linear and nonlinear effects.

In some embodiments, the steps of pre-compensation generally include determining a multi-level transmitter response of an optical transmitter. The multi-level transmitter response can be determined by providing the optical transmitter with a known multi-level signal. A known multi-level signal in this context is a signal that has an amplitude that varies over time. Thus, the transmitter response also captures effects due to system memory. Once determined, the transmitter response can be used to pre-emptively modify (e.g. pre-compensate) subsequent signals to correct impairments due to the response of the optical transmitter.

Pre-compensation can be performed using multi-dimensional look-up-tables (LUTs), wherein a first dimension of each LUT relates to the number of signals interacting (i.e., memory) in the nonlinear response, and a second dimension of each LUT relates to the amplitude of the distortion of the nonlinear response. Memory in this context means that the transmitter response at one time instant is dependent on the surrounding values of the waveform corresponding to other time instants. The multi-dimensional LUTs can encompass the full span of the transmitter response, or they can encompass only a part of the memory. In some embodiments, the multi-dimensional LUTs have a depth (e.g. memory) of 2 symbols (e.g. a signal/information state). In other embodiments, the LUTs have a depth of 3 symbols. In still other embodiments, the LUTs have a depth of more than 3 symbols.

By design, or by other practical constraints, the size of the LUT and/or the complexity of the nonlinearity equalizing circuitry can be chosen with consideration to system performance (e.g. the ability to closely replicate desired waveforms). For example, in an embodiment of a dual-polarization optical transmission system that imprints components of quadrature-amplitude modulation (QAM) signals onto orthogonal polarizations of an optical carrier signal, a LUT can be designated for each quadrature of each QAM signal and for each polarization of the optical carrier signal.

In some embodiments, LUT entries can be approximated based on a model functional dependence. In some embodiments, LUT entries and later pre-compensating patterns may be generated based on a polynomial function of the sought-after entry in time, as well as the surrounding entries related to the designed waveform.

Figure 10:
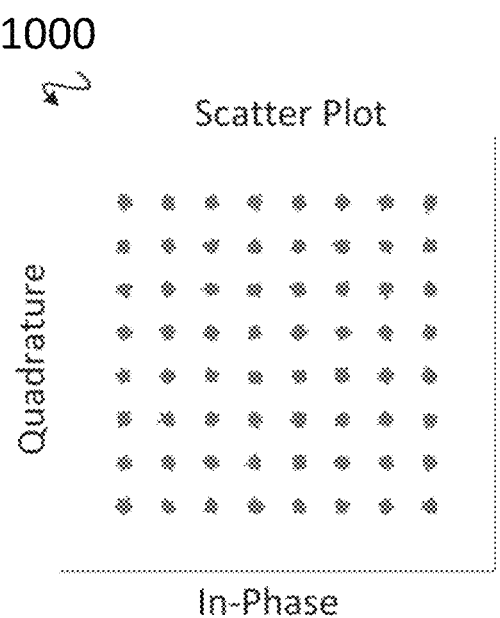
FIG. 10 shows a simplified constellation diagram corresponding to a modulated output signal that is unaffected by non-idealities of an optical transmitter.
Figure 11B:
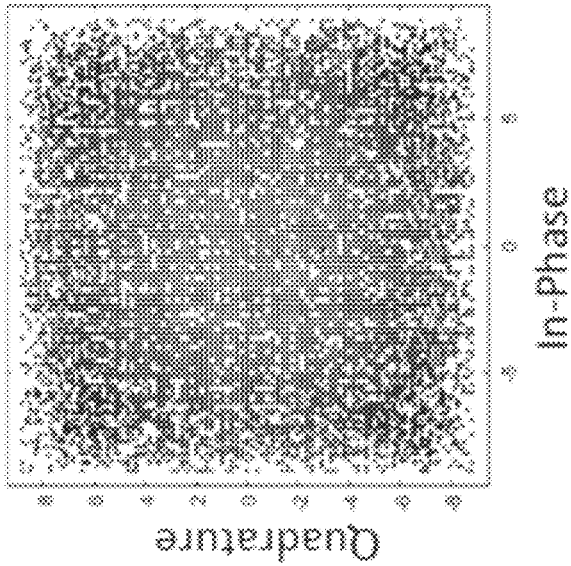
FIG. 11B shows a simplified constellation diagram corresponding to a modulated output signal affected by non-idealities of an optical transmitter, in absence of optical noise.

Because of the described non-idealities of optical transmitters, QAM symbol information imprinted onto an optical carrier signal by the optical transmitter (resulting in the modulated output signal) will accordingly suffer from impairments, as described with respect to FIGS. 10-11B. A constellation diagram of a QAM modulation scheme that is un-impaired is discussed next.

FIG. 10 shows a simplified constellation diagram 1000 corresponding to a modulated output signal that is unaffected by non-idealities of the optical transmitter that generated the modulated output signal. A constellation diagram is a two-dimensional scatter plot, in the horizontal and vertical plane, that represents a signal which has been modulated using modulation techniques such as phase-shift keying (PSK) or quadrature-amplitude modulation (QAM). Constellation points of a constellation diagram are often arranged in a square grid with equal vertical and horizontal spacing. As constellation points become closer together, the transmission system becomes more susceptible to noise and other impairments.

The simplified constellation diagram 1000 corresponds to a 64-QAM modulated signal corresponding to a single polarization of a dual-polarized optical carrier signal. As shown, the constellation diagram 1000 is substantially square and evenly-spaced. The horizontal-axis of the constellation diagram 1000 corresponds to the in-phase component of the 64-QAM modulated signal (I), and the vertical-axis of the constellation diagram corresponds to the quadrature component (Q) of the 64-QAM modulated signal.

As shown, the in-phase component of a 64-QAM modulated signal includes 8 unique amplitude levels that span the horizontal-axis of the constellation diagram 1000. The quadrature component of a 64-QAM modulated signal includes 8 unique phase-offsets that span the vertical-axis of the constellation diagram 1000. Thus, 64 unique symbols can be selected based on a combination of one of the 8 amplitude levels and one of the 8 phase-offsets.

Figure 11A:
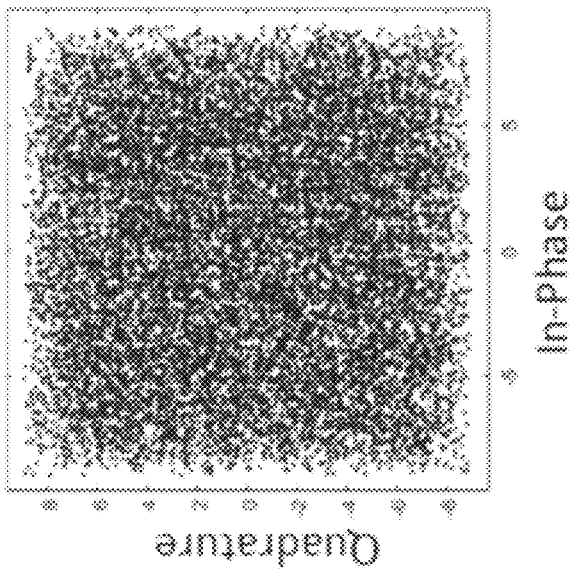
FIG. 11A shows a simplified constellation diagram corresponding to a modulated output signal affected by non-idealities of an optical transmitter and that is further affected by optical noise.

By way of contrast, FIG. 11A shows a simplified constellation diagram 1101 corresponding to a modulated output signal affected by non-idealities of the optical transmitter that generated the modulated output signal and that is further affected by optical noise. In the example shown, the simplified constellation diagram 1101 corresponds to a 64-QAM modulated signal that was imprinted onto a dual-polarized optical carrier signal. As shown, the information signal is completely lost. This is exemplified by an altogether smeared constellation diagram without any discernable (and clearly separated) constellation points.

FIG. 11B shows a simplified constellation diagram 1102 corresponding to a modulated output signal affected by non-idealities of the optical transmitter that generated the modulated output signal, in absence of optical noise, or any random, stochastic, or non-deterministic effects. As shown, even in absence of optical noise, the effects of transmitter non-idealities on the QAM modulated signal introduce significant smearing of the constellation diagram.

Figure 12:
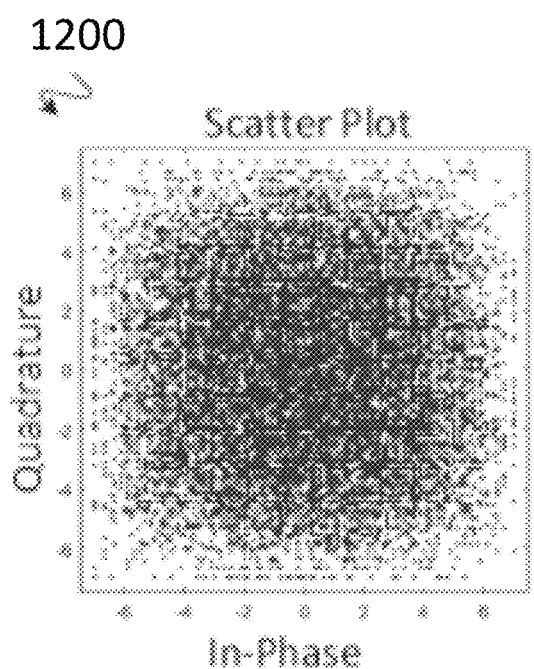
FIG. 12 shows a simplified constellation diagram corresponding to a modulated output signal of a non-ideal transmitter when equalized by a linear finite impulse response filter and nonlinear equalizer.

As discussed previously, a portion of the impairments discussed with reference to FIG. 11A and FIG. 11B can be mitigated using combined linear and nonlinear equalization techniques. FIG. 12 shows a simplified constellation diagram 1200 corresponding to a modulated output signal affected by non-idealities of the optical transmitter that generated the modulated output signal, when equalized by a linear finite impulse response (FIR) filter and a nonlinear equalizer. In the example shown, the nonlinear equalizer is implemented as a look-up table (LUT) that does not take system memory into account (e.g., a LUT having a depth of only one symbol). As can be seen, practically no improvement of signal quality is made by using the linear FIR filter and the single symbol LUT. In some embodiments, the nonlinear signal filtering system contains a single LUT, and no other linear or nonlinear system elements, and the single LUT can pre-, or post-compensate a signal with nonlinear distortions, with or without memory effects. In other embodiments, the nonlinear signal filtering system contains one or more linear system elements concatenated in series with one or more LUTs, where the LUTs performs nonlinear transformations (either instantaneous or including memory).

As has been described, in some embodiments, pre-compensation is performed by considering multiple time instances, rather than only a single time instant, thereby characterizing and correcting for system memory effects within an optical transmission system. Optical transmitter responses are characterized by providing a known multi-level signal to the optical transmitter and characterizing a multi-level response of the transmitter to that known signal.

In this Example, the nonlinear optical transmitter responses with memory effects are stored in a look-up-table (LUT) of response representations. In some embodiments, the LUT is multi-dimensional, i.e., multiple input elements (corresponding to multiple amplitudes at multiple time instants) result in multiple transmitter system response representations. Once acquired, transmitter system response representations can be used to pre-compensate subsequent digital data. In some embodiments, a transmitter response representation is a characterization of the transmitter system response. In some embodiments, a transmitter response representation includes values based on a characterization of the transmitter system response. In some embodiments, a transmitter response representation includes signal correction values based on a characterization of the transmitter system response. In some embodiments, if a particular functional dependence of the transmitter response is determined, signal correction values can be applied without the use of a LUT. In some embodiments, the LUT contains signal correction values instead of transmitter response representations.

The response of the optical transmitter can be determined for the full, or partial, duration of the system memory effects. In some embodiments, the transmitter response may not be performed using a signal that fully populates the LUT. Missing LUT entries can be interpolated, or extrapolated between the measured/trained points.

Figure 13A:
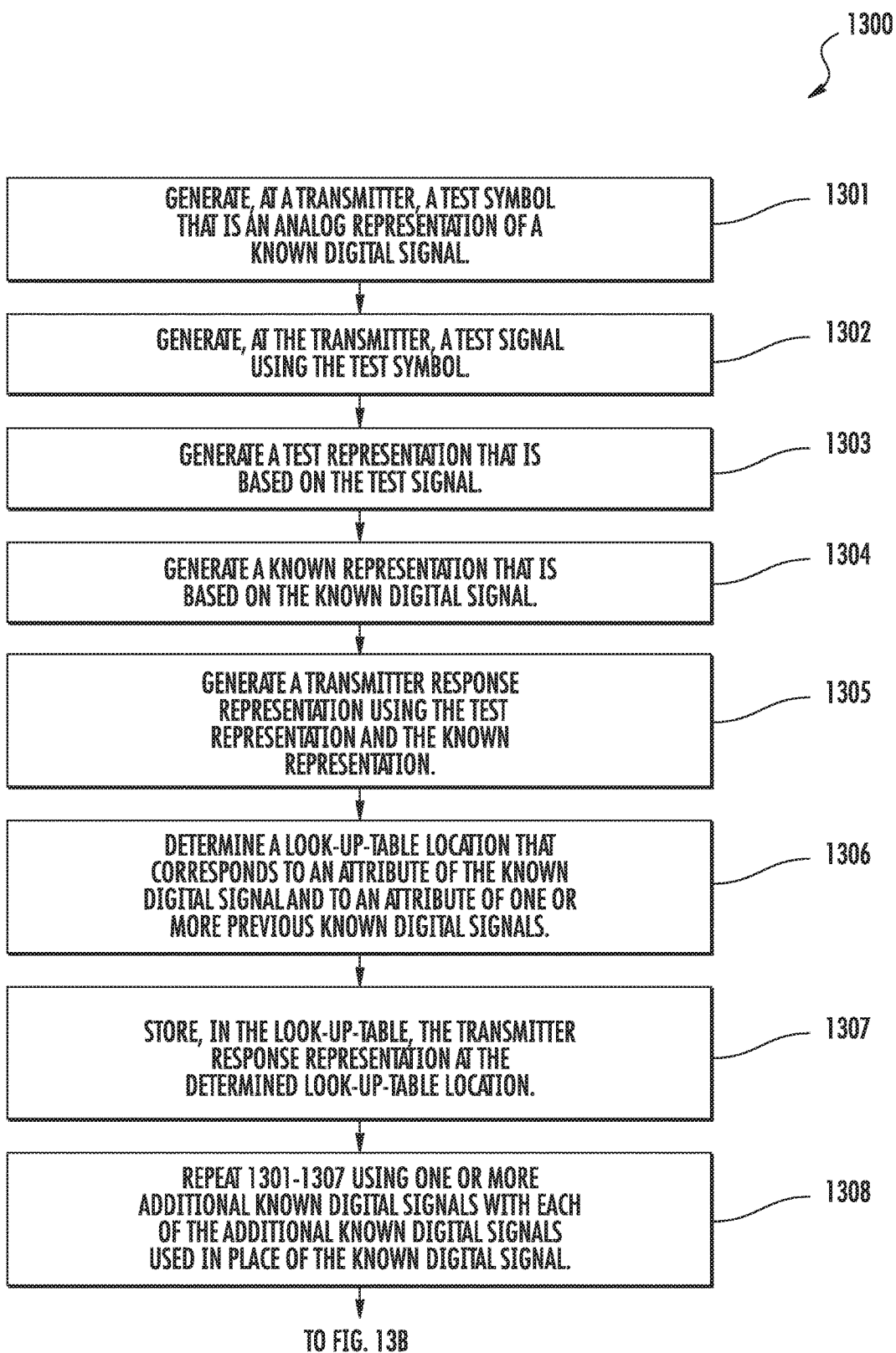
FIGS. 13A and 13B are a simplified flowchart of an example process for look-up-table based modification of transmission signals, in accordance with some embodiments.
Figure 13B:
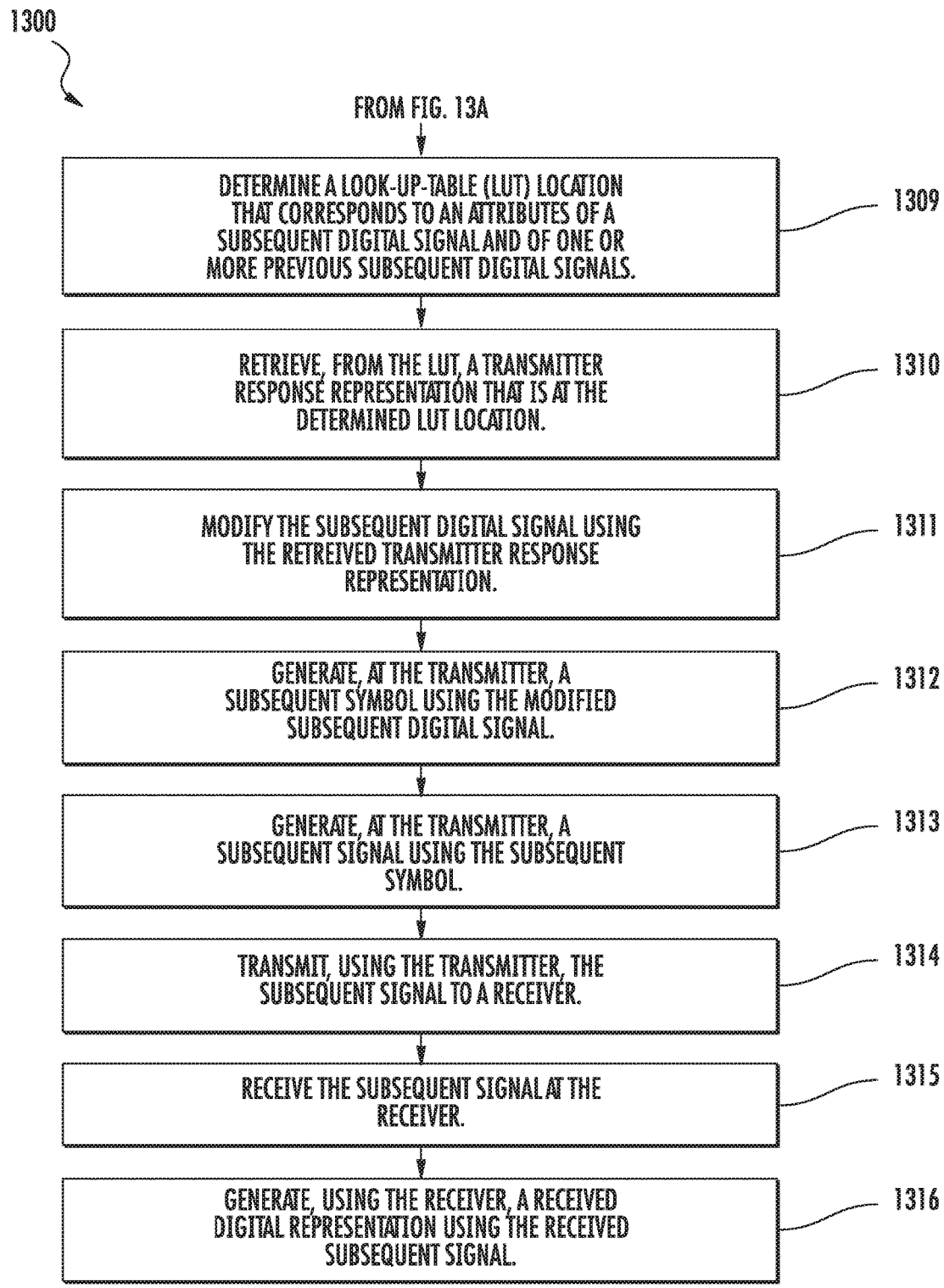

FIGS. 13A-B disclose improvements and modifications to the optical transmitter described with reference to FIG. 5B. These improvements and modifications are also applicable to a broader class of applications in the electronic and computerized arts including any application that utilizes a transmitter to transmit information using an electrical, audio, optical or radio signal.

FIG. 13A provides a portion of an example process 1300 for look-up-table based modification of transmission signals, in accordance with one or more example embodiments. The particular steps, order of steps, and combination of steps are shown for illustrative and explanatory purposes only. Other embodiments can use other specific steps, orders of steps, and/or combinations of steps to achieve a generally similar result.

At step 1301, a test symbol that is an analog representation of a known digital signal is generated at a transmitter (e.g. using the digital-to-analog converter 522 of the transmitter 521 shown in FIG. 5B). The known digital signal can be all, or a portion of, the digital input data 525 as was discussed with reference to FIG. 5B and the test symbol can be a QAM symbol. In some embodiments, the known digital signal includes information from an excitation-training waveform. Excitation-training waveforms can include pseudo-random multi-level sequences (e.g. pseudo-noise sequences). The excitation-training waveform can contain all, or a sub-set, of combinations/permutations of transmitter output levels (e.g. 8 amplitude levels for a 64-QAM signal) reproducible by the transmitter using the excitation-training waveform for a desired time window of samples. Given a 64-QAM modulation scheme having 8 amplitudes ("levels"), each quadrature can be stimulated using permutations of M=8 levels. For a multi-level excitation signal used to characterize N=3 symbols of system memory, the multi-level sequence would have at least $M^N=512$ level variations.

At step 1302, a test signal is generated at the transmitter using the test symbol. In some embodiments, the test signal is a modulated output signal generated using a modulator circuit of the transmitter (e.g. the DP-MZM circuit 524 as was discussed with reference to FIG. 5B). The modulator circuit can imprint information from the test symbol onto an optical carrier signal to generate the test signal.

Having excited the transmitter system using a known digital signal, the transmitter response can be determined by comparing a representation of an ideal output (based on the known digital signal) to a representation of the actual system output.

Accordingly, at step 1303, a test representation that is based on the test signal is generated. In some embodiments, the test representation is a direct digital representation of the test signal. In other embodiments, the test representation is a digital representation of the test signal generated after the test signal is down-converted and/or demodulated. In still other embodiments, the test representation is an analog representation of the test signal after the test signal is down-converted and/or demodulated.

Continuing, at step 1304, a known representation that is based on the known digital signal is generated. In some embodiments, the known representation is the known digital signal. In other embodiments, the known representation is an analog representation of the known digital signal.

Then, at step 1305, a transmitter response representation is generated using the test representation and the known representation. For example, the known digital signal might correspond to an ideal symbol amplitude of +3.0 volts. However, due to non-idealities of transmitter circuitry as has been described, the test symbol could have an actual amplitude of +2.7 volts (+0.3 volts lower than ideal). In some embodiments, a representation of the ideal amplitude (+3.0 volts) can be compared to a representation of the actual amplitude (+2.7 volts) as part of determining the transmitter response representation. In some embodiments, the transmitter response representation includes values used to modify or replace the amplitude of a symbol by modifying the digital value used to generate that symbol, or by modifying the amplitude of the symbol's analog signal directly.

As was previously discussed, to modify digital signals such that the effects of system memory are mitigated, each transmitter response representation can be stored in the multi-dimensional look-up-table, and retrieved from the look-up-table, taking into account the digital values that came before and/or after the digital value that the transmitter response representation is based on.

Accordingly, at step 1306, a look-up-table location (LUT) is determined, the location corresponding to an attribute of the known digital signal and to an attribute of one or more previous known digital signals. In some embodiments, the LUT location is a multi-dimensional index. In some embodiments, the attribute of the known digital signal is the actual amplitude of the test symbol and/or the test signal corresponding to the known digital signal. In other embodiments, the attribute of the known digital signal is an ideal amplitude of the test symbol and/or the test signal corresponding to the known digital signal. The attribute of the one or more previous known digital signals can include the amplitude of the previous test symbol generated using that previous known digital signal and can additionally include the order (e.g. sequentially in time) in which the previous test symbols were generated. Thus, the location within the LUT is not only determined using an attribute of a known digital signal, but is also determined using attributes of other known digital signals that surround the known digital signal in time (e.g. were output previously to the known digital signal, or after the known digital signal). In some embodiments, the LUTs are stored/implemented in one or more storage circuits (e.g. volatile or non-volatile memory and/or registers) of the optical transmitter. In other embodiments, LUTs are stored/implemented in one or more storage circuits coupled to the optical transmitter. Such coupling can include coupling over a network and the storage circuit can be a server.

At step 1307, the transmitter response representation is stored in the look-up-table at the determined LUT location. Then, at step 1308, steps 1301 through 1307 are repeated using one or more additional known digital signals with each of the additional known digital signals used in place of the known digital signal. Each of the additional transmitter response representations depends at least in part on a previous known digital signal. The LUT is thus populated with data for each of the variations of the possible transmitter output levels. In some embodiments, LUT generation is accomplished by sending the known digital signal multiple times and averaging, or otherwise weighting the generated responses, thus diminishing the effect of noise on the quality of the LUT entries.

The stored transmitter response representations determined as described with reference to FIG. 13A can be used immediately, or at a later time, to modify subsequent digital signals, i.e., digital transmission signals, or digital signals that are to be transmitted to a receiver. This is described in FIG. 13B, which provides a portion of the example process 1300 for look-up-table based modification of transmission signals, in accordance with one or more example embodiments.

Based on all or a portion (e.g. a bit sequence) of the digital value of the subsequent digital signal to be transmitted, and additionally based on the digital values of previous subsequent digital signals that have been transmitted or future subsequent digital signals to be transmitted, a previously stored transmitter response representation is retrieved from the LUT. Accordingly, at step 1309, a LUT location is determined that corresponds to attributes of the subsequent digital signal and to one or more previous or future subsequent digital signals. The LUT location can be determined using a process similar to that which was described with reference to step 1306 of FIG. 13A. Then, at step 1310, a transmitter response representation stored at the determined LUT location is retrieved from the LUT.

Having retrieved the transmitter response representation, the subsequent digital signal is modified, at step 1311, using the retrieved transmitter response representation. In some embodiments, the subsequent digital signal is modified using a correction value determined using the retrieved transmitter response. In other embodiments, the retrieved transmitter response includes the correction value. A correction value can be used to modify the subsequent digital signal directly, or can be used to correct an analog representation of the subsequent digital signal. For example, if the ideal amplitude of the subsequent symbol is +3.0 volts, and the retrieved transmitter response representation indicates that the actual amplitude of the symbol will be reduced by +0.3 volts due to non-idealities of the transmitter, the subsequent symbol's amplitude can be pre-compensated to have an amplitude corresponding to +3.3 volts, or other appropriate amplitude that has been determined to result in the desired amplitude for the subsequent symbol. In some embodiments, after step 1310 and before step 1311 the signal is further filtered through a linear system element such as a FIR filter (e.g., a tapped delay line element). In some embodiments, after step 1311 and before step 1312 the signal is further filtered through a linear system element such as a FIR filter (e.g., a tapped delay line element).

At step 1312, the subsequent symbol is generated (e.g. by a DAC circuit of the transmitter) using the modified subsequent digital signal. Next, at step 1313, a subsequent signal using the subsequent symbol is generated at the transmitter (e.g. using a modulator circuit of the transmitter). The transmitter then transmits the subsequent signal to a receiver at step 1314. The subsequent signal is received by the receiver at step 1315. Then, at step 1316, the receiver generates a received digital representation using the received subsequent signal. The received digital representation substantially matches the subsequent digital signal due to the modification of the transmitted subsequent signal.

Example results of pre-compensation as has been described with reference to FIG. 13A and FIG. 13B are discussed next.

Figure 14B:
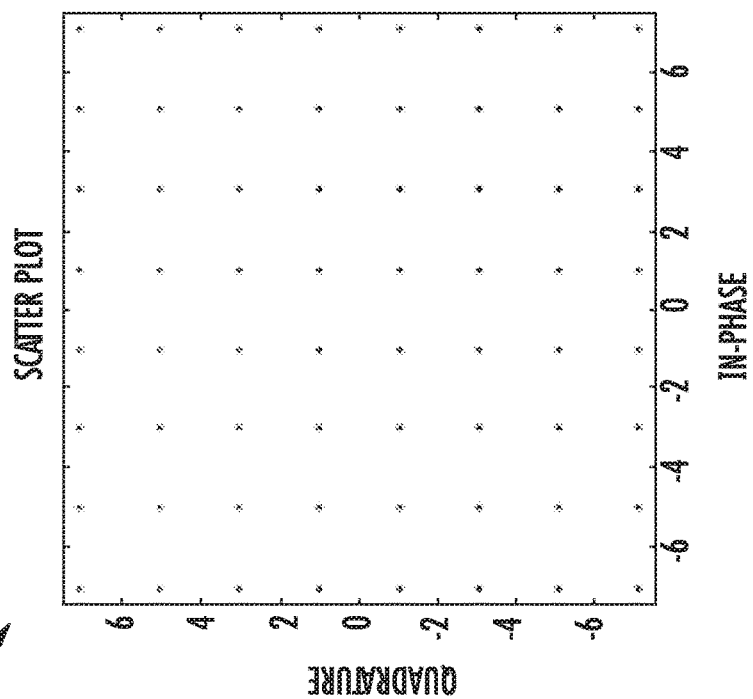
FIG. 14B shows a simplified constellation diagram corresponding to a modulated output signal of a non-ideal transmitter affected by non-idealities, in absence of optical noise, when corrected in accordance with some embodiments.
Figure 14A:
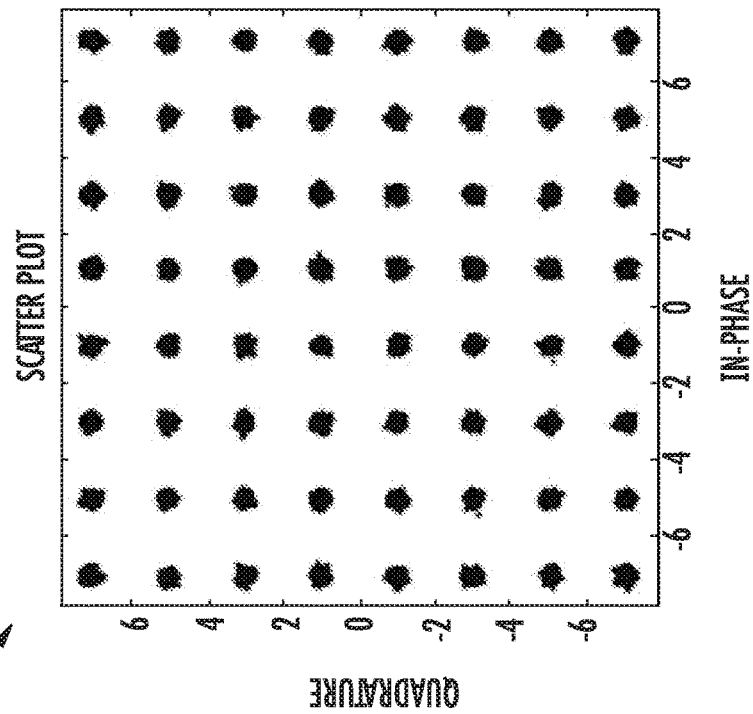
FIG. 14A shows a simplified constellation diagram corresponding to a modulated output signal of a non-ideal transmitter affected by non-idealities when corrected in accordance with some embodiments.

FIG. 14A shows a simplified constellation diagram 1401 corresponding to a modulated output signal of a non-ideal transmitter affected by non-idealities that has been corrected using look-up-table based pre-compensation of transmission signals, as described herein. In addition to nonlinear equalization using multi-dimensional (multi-symbol) look-up-table based pre-compensation, the transmission signal has been equalized using a FIR filter.

FIG. 14B shows a simplified constellation diagram 1402 corresponding to a modulated output signal similar to that which was described with reference to FIG. 14A, in absence of optical noise. In addition to nonlinear equalization using look-up-table based pre-compensation, the transmission signal has been equalized using a FIR filter. As shown in FIG. 14A and in FIG. 14B, a full recovery of the modulated output signal has been accomplished. Thus, information extracted from the modulated output signal substantially matches information from the corresponding subsequent digital signal.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A nonlinear signal filtering system comprising:
   a series of one or more filtering stages that filter a signal comprising a series of signal samples, each filtering stage comprising alternating linear system elements and nonlinear system elements, the signal being one of multiple independent signals that are filtered by the nonlinear signal filtering system;
   wherein the linear system elements and nonlinear system elements correct 1) sample interactions between a plurality of consecutive signal samples in the signal, and 2) nonlinear distortions in a value of each signal sample; and
   wherein the linear system elements and the nonlinear system elements process multiple independent input signals, that are parallelly inputted to each corresponding filtering stage, to produce multiple independent output signals, that are parallelly outputted from said filtering stage, to filter the multiple independent signals.

2. The nonlinear signal filtering system of claim 1, wherein the linear system elements comprise tapped delay lines.

3. The nonlinear signal filtering system of claim 1, wherein:
   the signal comprises a first signal sample in the series of signal samples affected by an interaction with N consecutive signal samples adjacent to the first signal sample; and
   the value of each signal sample in the series of signal samples is subject to nonlinear distortions.

4. The nonlinear signal filtering system of claim 3, wherein:
   the linear system elements in each filtering stage comprise linear filtering functions each comprising from 1 to N parameters;
   the nonlinear system elements in each filtering stage comprise nonlinear filtering functions each comprising from 1 to M parameters; and
   the total number of parameters used in each filtering stage to correct 1) the sample interactions between the plurality of consecutive signal samples in the signal, and 2) the nonlinear distortions in the value of each signal sample, is equal to, or less than the sum of N and M.

5. The nonlinear signal filtering system of claim 4, wherein M is from 1 to 10.

6. The nonlinear signal filtering system of claim 4, wherein the nonlinear filtering functions are instantaneous functions selected from the group consisting of: piece-wise linear functions, nonlinear functions, or piece-wise nonlinear functions.

7. The nonlinear signal filtering system of claim 1, comprising from 2 to 10 filtering stages connected sequentially in series to receive and filter the series of signal samples.

8. The nonlinear signal filtering system of claim 1, wherein:
   the multiple independent output signals processed by one of the linear system elements comprise linear combinations of more than one of the multiple independent input signals; and
   the linear combination describes linear cross-coupling between the more than one of the multiple independent input signals.

9. The nonlinear signal filtering system of claim 1, wherein:
the multiple independent output signals processed by one of the non-linear system elements comprise non-linear transformations of more than one of the multiple independent input signals.

10. The nonlinear signal filtering system of claim 7, wherein:
a first filtering stage comprises a first linear system element and a first nonlinear system element;
each subsequent filtering stage comprises a subsequent linear system element and a subsequent nonlinear system element;
the first linear system element in the first filtering stage produces a linear combination of the series of signal samples by means of scaling each signal sample in the series of signal samples by first scaling parameters, sums a first number of consecutive scaled signal samples, and produces a first series of linearly transformed signal samples;
the first nonlinear system element in the first filtering stage transforms each of the samples in the first series of linearly transformed signal samples according to a first instantaneous nonlinear function, and produces a first series of nonlinearly transformed signal samples;
the subsequent linear system elements in the subsequent stages scale each transformed signal sample in the series of nonlinearly transformed signal samples produced by a preceding stage by subsequent scaling parameters, sums a subsequent number of consecutive scaled signal samples, and produces a subsequent series of linearly transformed signal samples;
the subsequent nonlinear system elements in the subsequent stages transform the subsequent series of linearly transformed signal samples according to a subsequent instantaneous nonlinear function, and produces a subsequent series of nonlinearly transformed signal samples; and
the first scaling parameters, the subsequent scaling parameters, the first instantaneous nonlinear function, and the subsequent instantaneous nonlinear functions correct for the sample interactions and the nonlinear distortions.

11. The nonlinear signal filtering system of claim 7, wherein:
each filtering stage comprises one of the linear system elements and one of the nonlinear system elements;
a first one of the linear system elements in a first one of the filtering stages receives as its input each signal sample in the series of signal samples;
each subsequent linear system element receives as its input an output of a preceding nonlinear system element;
each nonlinear system element receives as its input an output of a preceding linear system element;
each linear system element produces an output of linearly transformed signal samples;
each nonlinear system element produces an output of nonlinearly transformed signal samples;
each linear system element scales its input by scaling parameters and sums a plurality of consecutive scaled signal samples for each linearly transformed signal sample;
each nonlinear system element transforms its input according to an instantaneous nonlinear function for each nonlinearly transformed signal sample.

12. The nonlinear signal filtering system of claim 7, wherein:
a first filtering stage comprises:
a first linear system element that scales each signal sample in the series of signal samples by scaling parameters and sums a plurality of consecutive scaled signal samples; and
a first stage nonlinear system element that transforms an output of the first linear system element according to an instantaneous nonlinear function;
each subsequent filtering stage comprises:
a subsequent linear system element that scales the output of a preceding stage by scaling parameters and sums a plurality of consecutive scaled signal samples; and
a subsequent nonlinear system element, wherein the nonlinear system element transforms an output of the preceding linear system element according to an instantaneous nonlinear function; and
the scaling parameters in the linear system elements and the instantaneous nonlinear functions of the nonlinear system elements correct for the sample interactions and the nonlinear distortions in the value of each signal sample.

13. The nonlinear signal filtering system of claim 7, wherein:
a first filtering stage comprises a first linear system element and a first nonlinear system element;
a second filtering stage comprises a second linear system element and a second nonlinear system element;
the first linear system element scales each signal sample in the series of signal samples by first scaling parameters, sums a first number of consecutive scaled signal samples, and produces a first series of linearly transformed signal samples;
the first nonlinear system element transforms the first series of linearly transformed signal samples according to a first instantaneous nonlinear function, and produces a first series of nonlinearly transformed signal samples;
the second linear system element scales each transformed signal sample in the first series of nonlinearly transformed signal samples by second scaling parameters, sums a second number of consecutive scaled signal samples, and produces a second series of linearly transformed signal samples;
the second nonlinear system element transforms the second series of linearly transformed signal samples according to a second instantaneous nonlinear function, and produces a second series of nonlinearly transformed signal samples; and
the first and second scaling parameters and the first and second instantaneous nonlinear functions correct for the sample interactions and the nonlinear distortions.

14. A nonlinear signal filtering system comprising:
a first linear system element that receives a signal comprising a series of signal samples the signal being one of multiple independent signals that are filtered by the nonlinear signal filtering system;
a first nonlinear system element connected to receive an output of the first linear system element; and
a second linear system element connected to receive an output of the first nonlinear system element;
and wherein:
a first signal sample in the series of signal samples is affected by an interaction with one or more consecutive signal samples adjacent to the first signal sample;

a value of each signal sample in the series of signal samples is subject to nonlinear distortions;

the first linear system element scales each signal sample in the series of signal samples using scaling parameters and sums a plurality of consecutive scaled signal samples;

the first nonlinear system element transforms the output of the first linear system element according to an instantaneous nonlinear function;

the second linear system element scales the output of the first nonlinear system element by scaling parameters and sums a plurality of consecutive scaled outputs of the first nonlinear system element;

the scaling parameters in the first linear system element and the second linear system element and the instantaneous nonlinear function of the first nonlinear system element correct for the signal sample interactions and the nonlinear distortions in the value of each signal sample; and the first and second linear system elements and the first nonlinear system element process multiple independent input signals, that are parallelly inputted to each corresponding element, to produce multiple independent output signals, that are parallelly outputted from said element, to filter the multiple independent signals.

15. The nonlinear signal filtering system of claim 14, wherein:

the consecutive signal samples are one of: before the first signal sample, after the first signal sample, or both before and after the first signal sample; and the number of consecutive scaled signal samples that are summed by the first linear system element is from 1 to 200.

16. The nonlinear signal filtering system of claim 14, wherein:

the nonlinear distortions in the value of each signal sample are described by functions selected from the group consisting of: piece-wise linear functions, nonlinear functions, or piece-wise nonlinear functions.

17. The nonlinear signal filtering system of claim 14, wherein:

the first linear system element is a tapped delay line.

18. The nonlinear signal filtering system of claim 14, wherein:

the instantaneous nonlinear function of the first nonlinear system element is a function selected from the group consisting of: piece-wise linear functions, nonlinear functions, or piece-wise nonlinear functions.

19. The nonlinear signal filtering system of claim 14, wherein:

the second linear system element is a tapped delay line.

20. A method for filtering multiple independent signals comprising:

providing a signal comprising a series of signal samples, wherein a first signal sample in the series of signal samples is affected by an interaction with one or more consecutive signal samples adjacent to the first signal sample, a value of each signal sample is subject to nonlinear distortions, and the signal is one of the multiple independent signals;

filtering the signal through a first linear system element, wherein the first linear system element scales each signal sample by a scaling parameter and sums a plurality of consecutive scaled signal samples; and filtering an output of the first linear system element using a first nonlinear system element, wherein the first nonlinear system element transforms the output of the first linear system element according to an instantaneous nonlinear function;

wherein the scaling parameters in the first linear system element and the instantaneous nonlinear function of the first nonlinear system element correct for the signal sample interactions and the nonlinear distortions in the value of each signal sample in the signal, and wherein the first linear system element and the first nonlinear system element process multiple independent input signals, that are parallelly inputted to each corresponding element, to produce multiple independent output signals, that are parallelly outputted from said element, to filter the multiple independent signals.

21. The method of claim 20, wherein:

the consecutive signal samples are selected from the group consisting of: a set of signal samples before the first signal sample, a set of signal samples after the first signal sample, or a set of signal samples both before and after the first signal sample, and the number of consecutive scaled signal samples that are summed by the first linear system element is from 1 to 200.

22. The method of claim 20, wherein:

the nonlinear distortions in the value of each signal sample are described by functions selected from the group consisting of: piece-wise linear functions, nonlinear functions, or piece-wise nonlinear functions.

23. The method of claim 20, wherein:

the first linear system element is a tapped delay line.

24. The method of claim 20, wherein:

the instantaneous nonlinear function of the first nonlinear system element is a function selected from the group consisting of: piece-wise linear functions, nonlinear functions, or piece-wise nonlinear functions.

25. The method of claim 20, further comprising:

filtering an output of the first nonlinear system element using a second linear system element, wherein the second linear system element scales the output of the first nonlinear system element by a scaling coefficient and sums a plurality of consecutive scaled outputs of the first nonlinear system element;

wherein the scaling parameters in the first and the second linear system elements and the instantaneous nonlinear function of the first nonlinear system element correct for the signal sample interactions and the nonlinear distortions in the value of each signal sample in the signal.

26. The method of claim 25, wherein:

the second linear system element is a tapped delay line.

27. A method for filtering multiple independent signals comprising:

providing a signal comprising a series of signal samples, wherein a first signal sample in the series of signal samples is affected by an interaction with one or more consecutive signal samples adjacent to the first signal sample, a value of each signal sample is subject to nonlinear distortions, and the signal is one of the multiple independent signals;

filtering the signal through a first linear system element, wherein the first linear system element scales each signal sample by a scaling coefficient and sums a plurality of consecutive scaled signal samples; and filtering an output of the first linear system element using a first nonlinear system element, wherein the first nonlinear system element transforms the output of the first linear system element according to a multi-dimensional look-up-table;

wherein the scaling coefficients in the first linear system element and the multi-dimensional look-up-table of the first nonlinear system element correct for the signal sample interactions and the nonlinear distortions in the value of each signal sample in the signal; and wherein the first linear system element and the first nonlinear system element process multiple independent input signals, that are parallelly inputted to each corresponding element, to produce multiple independent output signals, that are parallelly outputted from said element, to filter the multiple independent signals.

28. The method of claim 27, wherein:
the first linear system element is a tapped delay line.

29. The method of claim 27, wherein:
the first linear system element is a finite impulse response filter.

30. The method of claim 27, wherein:
the multi-dimensional look-up-table comprises one dimension that relates to the number of consecutive signal samples interacting with the first signal sample.

\* \* \* \* \*